(12) United States Patent
Sharon et al.

(10) Patent No.: US 8,374,026 B2
(45) Date of Patent: Feb. 12, 2013

(54) SYSTEM AND METHOD OF READING DATA USING A RELIABILITY MEASURE

(75) Inventors: Eran Sharon, Rishon Lezion (IL); Idan Alrod, Herzliya (IL)

(73) Assignee: Sandisk IL Ltd., Kfar Saba (IL)

( * ) Notice: Subject to any disclaimer, the term of this patent is extended or adjusted under 35 U.S.C. 154(b) by 185 days.

(21) Appl. No.: 12/944,431

(22) Filed: Nov. 11, 2010

(65) Prior Publication Data
US 2011/0066902 A1    Mar. 17, 2011

Related U.S. Application Data

(63) Continuation-in-part of application No. 12/363,554, filed on Jan. 30, 2009, now Pat. No. 7,995,387.

(51) Int. Cl.
*G11C 11/34* (2006.01)
(52) U.S. Cl. .......... 365/185.02; 365/185.03; 365/185.09
(58) Field of Classification Search ............. 365/185.02, 365/185.09, 185.03
See application file for complete search history.

(56) References Cited

U.S. PATENT DOCUMENTS

| | | | |
|---|---|---|---|
| 5,867,429 | A | 2/1999 | Chen et al. |
| 6,411,549 | B1 * | 6/2002 | Pathak et al. ............. 365/185.2 |
| 7,158,414 | B2 * | 1/2007 | Kuo ............................ 365/185.2 |
| 7,196,946 | B2 | 3/2007 | Chen et al. |
| 7,436,733 | B2 | 10/2008 | Mokhlesi |
| 7,483,306 | B2 * | 1/2009 | Lin .......................... 365/185.21 |
| 7,526,715 | B2 | 4/2009 | Litsyn et al. |
| 7,533,328 | B2 | 5/2009 | Alrod et al. |
| 7,751,237 | B2 | 7/2010 | Alrod et al. |
| 7,814,401 | B2 | 10/2010 | Alrod et al. |
| 7,995,387 | B2 | 8/2011 | Sharon et al. |
| 2007/0242510 | A1 | 10/2007 | Hermink |
| 2008/0151667 | A1 | 6/2008 | Miu et al. |
| 2008/0250300 | A1 | 10/2008 | Mokhlesi et al. |
| 2008/0263265 | A1 | 10/2008 | Litsyn et al. |
| 2009/0199074 | A1 | 8/2009 | Sommer |
| 2009/0217131 | A1 | 8/2009 | Litsyn et al. |

FOREIGN PATENT DOCUMENTS

| | | |
|---|---|---|
| WO | 2007132453 A2 | 11/2007 |
| WO | 2008026203 A2 | 3/2008 |

OTHER PUBLICATIONS

Restriction Requirement for U.S. Appl. No. 121363,554 mailed Aug. 27, 2010, 6 pages.
Notice of Allowance and Fees(s) Due for U.S. Appl. No. 12/363,554 mailed Nov. 12, 2010, 7 pages.
Non-Final Office Action for U.S. Appl. No. 13/152,001 mailed Mar. 2, 2012, 5 pages.
Notice of Allowance and Fee(s) Due for U.S. Appl. No. 12/363,554 mailed Mar. 3, 2011, 5 pages.

\* cited by examiner

*Primary Examiner* — Son Dinh
(74) *Attorney, Agent, or Firm* — Toler Law Group, PC

(57) ABSTRACT

In a particular embodiment, a data storage device includes a memory array including a target memory cell and one or more other memory cells. The data storage device also includes a controller coupled to the memory array. The controller is configured to directly compute a reliability measure for at least one bit stored in the target memory cell of the memory array based on a voltage value associated with the target memory cell and based on one or more corresponding voltage values associated with each of the one or more other memory cells of the memory array.

21 Claims, 14 Drawing Sheets

US 8,374,026 B2

SYSTEM AND METHOD OF READING DATA USING A RELIABILITY MEASURE

CROSS-REFERENCE TO RELATED APPLICATIONS

The present disclosure is a continuation-in-part of, and claims priority from U.S. patent application Ser. No. 12/363,554, filed on Jan. 30, 2009, now issued as U.S. Pat. No. 7,995,387, and having the same inventors as the present application, the content of which is expressly incorporated by reference herein in its entirety.

FIELD OF THE DISCLOSURE

The present disclosure is generally related to reading data using a reliability measure.

BACKGROUND

Non-volatile memory devices, such as universal serial bus (USB) flash memory devices or removable storage cards that hold data between power cycles, have allowed for increased portability of data and software applications. As process advances enable smaller physical dimensions of memory cells, physical effects such as coupling between floating gates of transistors of neighboring cells become more pronounced. Under certain circumstances, a read operation or a write operation at one memory cell may affect a charge level that is read from an adjacent memory cell.

SUMMARY

Systems and methods to read data stored on a data storage device are disclosed. A reliability measure of the read data of a particular memory cell can be directly computed using a threshold value of the particular memory cell and threshold values of one or more neighboring memory cells. For example, a reliability measure can be retrieved from a look up table or computed using a parametric model based on the read threshold value of the memory cell and its neighboring cells. The reliability measure and an estimated bit value may be provided to an error correction code (ECC) decoder as a "soft" bit estimate to generate decoded data.

DETAILED DESCRIPTION

Figure 1:
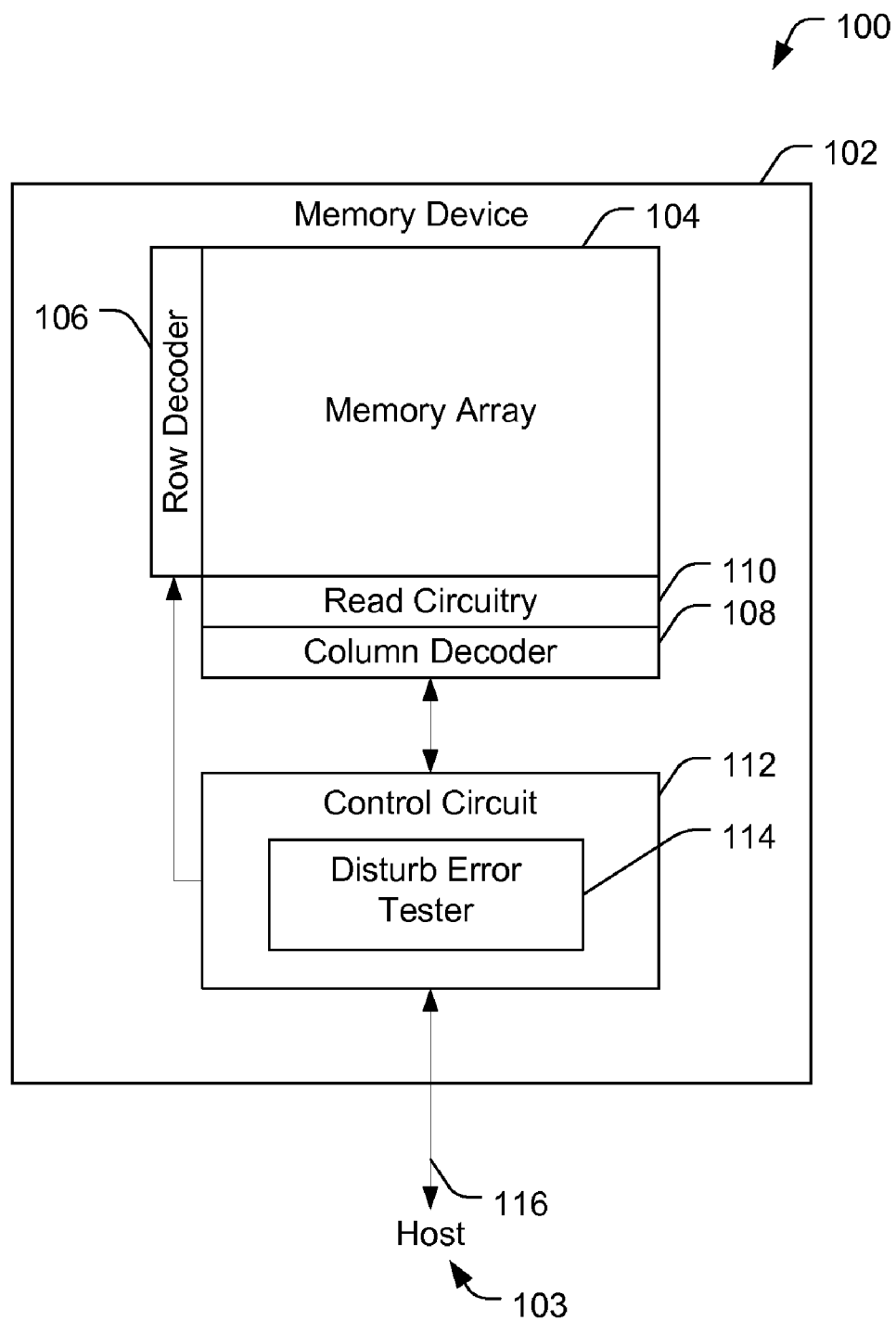
FIG. 1 is a block diagram of a particular embodiment of a system to read data that is subject to a disturb condition.

Referring to FIG. 1, a particular embodiment of a system to read data that is subject to a disturb condition is illustrated. The system 100 includes a memory device 102 in communication with a host 103 via a channel 116. The memory device 102 includes a memory array 104 coupled to a control circuit 112 that includes a disturb error tester 114. Data read from the memory array 104 in response to a data read operation is tested for a possible disturb error and corrected before being provided to a requesting device.

In a particular embodiment, the memory array 104 includes an array of memory cells that are accessible via a row decoder 106 and a column decoder 108. The row decoder 106 and the column decoder 108 are responsive to the control circuit 112. One or more addressed memory cells of the memory array 104 may be read via read circuitry 110 coupled to the memory array 104. In a particular embodiment, the memory array 104 is configured as a memory array of a flash device, such as a NAND flash device, a NOR flash device, a flash electrically erasable programmable read-only memory (EEPROM) device, or any other type of flash device.

The read circuitry 110 is configured to read a state of an addressed memory cell and to compare the state to at least one reference voltage level associated with at least two memory state ranges. For example, the memory cells may be flash cells that store charge at a floating gate of a transistor. The amount of charge stored at the floating gate affects a threshold voltage of the transistor. The threshold voltage may be compared to one or more reference voltage levels to determine whether the threshold voltage is within a first voltage range indicating a first value or a second voltage range indicating a second value. The read circuitry 110 may be programmed to compare the state of the memory cell to an appropriate number of memory state ranges. For example, in a sixteen-level flash memory, the read circuitry 110 may determine a particular state of sixteen states that corresponds to a particular memory cell.

The control circuit 112 is configured to receive memory access requests from the host 103 via the channel 116 and is coupled to the read circuitry 110 and the row and column decoders 106 and 108 to initiate read or write operations at the memory array 104. The control circuit 112 is also configured to process data read from the memory array 104. The control circuit 112 is configured to provide read data to the disturb error tester 114.

The disturb error tester 114 is configured to determine whether a particular memory cell is prone to having a disturb error based at least partially on states on other memory cells. For example, states of one or more memory cells other than a requested memory cell may also be read and provided to the disturb error tester 114 as a set of joint states to determine if the joint states are correlated to a disturb error. For example, the states of neighboring cells may be compared to one or more patterns of joint states that have been classified as being correlated to a disturb error or not correlated to a disturb error. The control circuit 112 is responsive to the disturb error tester 114 to initiate a reliability update process when the states of neighboring cells match a predetermined pattern of joint states that is classified as being correlated to a disturb error. For example, the predetermined pattern may correspond to a potential probability of a disturb error with respect to a value stored at the addressed cell.

During operation, a memory read request may be received at the control circuit 112 to read data including a value at a particular memory cell of the memory array 104. The control circuit 112 may initiate a read operation at the particular memory cell as well as at one or more neighboring memory cells. The control circuit 112 may determine which neighboring memory cells to read based on known correlations related to disturb mechanisms such as, for example, program disturb conditions, read disturb conditions, other disturb conditions, or any combination thereof.

For example, offline studies may determine correlations between the readings of certain cells and an associated set of other cells. The locations of the other cells that are correlated to program disturbs or read disturbs at the certain cells may be recorded and stored or encoded at the control circuit 112. To illustrate, the offline study may indicate that memory cells sharing a bit line with a particular cell and within four word lines of the particular cell may be sufficiently coupled to the particular cell such that a write operation may affect the state of the particular cell. Such a disturbance to the state of the particular cell due to a write operation occurring at another cell is referred to as a "program disturb," "programming disturb," and "programming-time disturb." As another illustration, the offline study may indicate that memory cells sharing a bit line with a particular cell and within four word lines of the particular cell may be sufficiently coupled to the particular cell such that a read operation may affect the state of the particular cell. Such a disturbance to the state of the particular cell due to a read operation occurring at another cell may be referred to as a "read disturb," "reading disturb," and "reading-time disturb."

In addition to potentially identifying memory cells sharing a same bitline as sufficiently coupled to the particular cell to cause a program disturb or read disturb, as another illustrative, non-limiting example, the offline study may indicate that the two nearest memory cells sharing the same word line of the particular cell, or the four diagonally adjacent cells at adjacent word lines and bit lines, or any combination thereof, may be sufficiently coupled to the particular cell to cause a program disturb or a read disturb. Memory cells that are determined to be sufficiently coupled to the particular cell and hence potentially cause a disturb condition at the particular cell as a result of a data write or read operation are referred to as "neighbor cells." Although referred to as "neighbor," such cells need not be physically adjacent to the particular cell and may instead be at any location within the memory array 104. For example, a neighbor cell may be at any location within a same block as the particular cell.

The joint states of the neighboring cells may be read by the read circuitry 110 and provided by the control circuit 112 to the disturb error tester 114. In a particular embodiment, the state of the particular cell may also be included in the joint states. The disturb error tester 114 may classify the readings of the joint states into classes, e.g. the class of readings which are in correlation with a disturb event and the class of readings which are in correlation with a non-disturb event. The control circuit 112 may modify a reliability measure of the state of the particular cell according to the classification of the reading.

In a particular embodiment, the class of readings which are in correlation with a disturb event may be determined via a lookup operation at the control circuit 112. For example, offline studies may identify patterns of joint states of neighbor cells that are correlated to a disturb event at the particular cell. Data identifying such patterns may be retrieved and compared to the joint states read in connection with the particular cell, to determine whether the state of the particular cell is prone to have been disturbed prior to the reading.

By comparing the joint states to patterns of states that are correlated to disturb events or that are correlated to non-disturb events at the particular cell, a determination may be made whether the state of the particular cell is prone to have a disturb error. Such determination may be made based on empirical observations and may be more accurate than predictions of disturbs based on models, such as models that estimate or calculate cross-coupling coefficients between adjacent cells to predict disturb events. Similarly, performing comparisons with joint state patterns correlated with disturb events or non-events may be more computationally efficient than computing determinations using physical models. Thus, improved accuracy of prediction, reduced processing requirements to generate the prediction, or both, may be achieved in comparison to systems using physical model calculations to determine disturb events.

Figure 2:
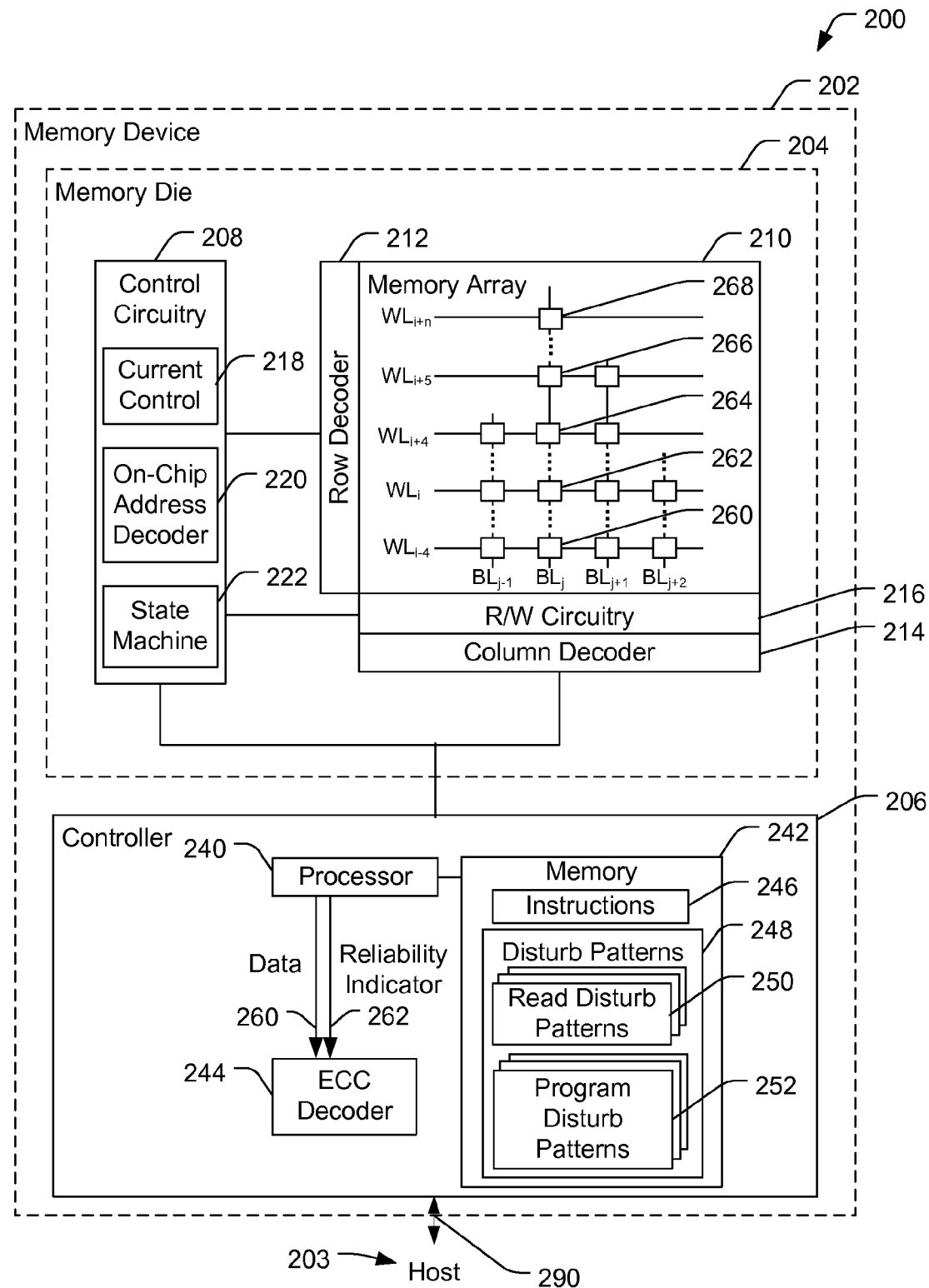
FIG. 2 is a block diagram of a second particular embodiment of a system to read data is subject to a disturb condition.

FIG. 2 is a block diagram of a second particular embodiment of a system to read data that is subject to a disturb condition. The system 200 includes a memory device 202 in communication with a host 203 via a channel 290. The memory device 202 includes a controller 206 that is coupled to one or more dies, such as a representative memory die 204. In an illustrative embodiment, the memory device 202 may be the memory device 102 of FIG. 1.

The memory die 204 includes a memory array 210, control circuitry 208, and read/write circuitry 216. The memory array 210 may be a two-dimensional array or a three-dimensional array of memory cells. The memory array 210 is addressable by word lines via a row decoder 212 and by bit lines via a column decoder 214. The read/write circuitry 216 may be operative to enable a page of memory cells to be read or programmed in parallel.

The control circuitry 208 cooperates with the read/write circuitry 216 to perform memory operations at the memory array 210. In a particular embodiment, the control circuitry 208 includes a state machine 222, an on-chip address decoder 220, and a current control module 218. The state machine 222 may provide chip-level control of memory operations. The on-chip address decoder 220 may provide an address interface between that used by the host 203 or a memory controller to the hardware address used by the decoders 212 and 214. The current control module 218 may control the current and/or voltages supplied to the word lines and bit lines during memory operations.

The memory array 210 includes representative word lines WL(i−4), WL(i), WL(i+4), WL(i+5) and WL(i+n). The memory array 210 also includes representative bit lines BL(j−1), BL(j), BL(j+1), and BL(j+2). Representative memory cells are depicted at intersections of word lines and bit lines, such as representative memory cells $M_{i-4,j}$ 260, $M_{i,j}$ 262, $M_{i+4,j}$ 264, $M_{i+5,j}$ 266, and $M_{i+n,j}$ 268 coupled to the bit line BL(j).

The controller 206 is included in the same memory device 202 (e.g., a removable storage card) as the one or more memory die 204. Commands and data may be transferred between the host 203 and the controller 206 via one or more lines of the channel 290. The controller 206 includes a processor 240 coupled to a memory 242 and also includes an error correction code (ECC) decoder 244.

In a particular embodiment, the memory 242 includes program instructions 246 that are executable by the processor 240 to receive values that are read from neighbor cells of an addressed cell and to compare the received values to one or more disturb patterns 248. The disturb patterns 248 may be stored at the memory 242 and may include one or more read disturb patterns 250. Alternatively or in addition, the disturb patterns 248 may include one or more program disturb patterns 252. For example, the disturb patterns 248 may represent combinations of one or more values of neighbor cells (and may also include values of an addressed cell) that have been determined to correlate to a disturb condition at the addressed cell.

The program instructions 246 may be executable by the processor 240 to provide data 260 to the ECC decoder 244 corresponding to a value read from the addressed cell and also to provide a reliability indicator 262 to the ECC decoder 244. The reliability indicator 262 may be at least partially based on the processor 240 determining a match between the read values and one or more of the disturb patterns 248. For example, when the read values are determined to match a disturb pattern 248 that is correlated to a disturb error at an addressed cell, the reliability indicator 262 may indicate that the data 260 is less reliable than when the read values do not match a disturb pattern 248 that is correlated to a disturb error.

In a particular embodiment, the ECC decoder 244 is configured to receive the data 260 and the reliability indicator 262 and to perform a correction operation at least partially based on the reliability indicator 262. For example, the reliability indicator 262 can include a soft error bit value corresponding to the data 260. In a particular embodiment, the reliability indicator 262 can indicate a log-likelihood ratio (LLR) for the bit.

During operation, the controller 206 may receive a data read request from the host 203 and may initiate a read operation to read a first value stored at a first memory cell and to read a second value stored at a second memory cell. For example, when the data read request includes request for data stored at $M_{i,j}$ 262, the controller 206 may also initiate reads of neighbor cells whose combination of values may be correlated to a program disturb and may be used in comparison to one or more of the program disturb patterns 252. To illustrate, the controller 206 may also read values of cells sharing the same bit line (BL(j)) as the addressed cell $M_{i,j}$ 262, such as a first value from $M_{i-4,j}$ 260 and a second value $M_{i+4,j}$ 264.

The controller 206 may be configured to compare at least the first value and the second value to a predetermined pattern, where the predetermined pattern corresponds to a potential probability of a disturb error with respect to a value stored at the addressed memory cell. For example, in a particular embodiment, the controller 206 may compare the states of the read cells $M_{i-4,j}$ 260, and $M_{i+4,j}$ 264 to one or more of the disturb patterns 248. As another example, in a particular embodiment, the controller 206 may compare the states of the read cell $M_{i-4,j}$ 260 and the addressed cell $M_{i,j}$ 262 to one or more of the disturb patterns 248. As will be discussed more with respect to FIG. 3, the predetermined pattern may represent comparisons of values to one or more thresholds. To illustrate, one or more of the disturb patterns 248 may include the second value exceeding a first threshold, the second value not exceeding a second threshold, or both. The controller 206 may provide a reliability measure to the ECC decoder 244 via the reliability indicator 262 based on whether the first value and the second value match the particular pattern. In the examples provided, the read cells are located at word lines that are non-adjacent to the addressed cell (e.g., WL(i) is separated from WL(i+4) by intervening word lines WL(i+1), WL(i+2), and WL(i+3)) and illustrate that disturb errors that are tested by comparison to the disturb patterns 248 do not include errors such as cross-coupling cancellation between adjacent cells.

Although the neighbor cells to the addressed cell $M_{i,j}$ 262 that are read and whose values are compared to the disturb patterns 248 are illustrated as the cells $M_{i-4,j}$ 260 and $M_{i+4,j}$ 264 that are coupled to the same BL(j) as the addressed cell $M_{i,j}$ 262 at non-adjacent word lines, in other embodiments the neighbor cells that are read may include any cells within the memory array 210, such as any or all of the cells 262-268 coupled to the same bit line, or cells coupled to the same word line WL(j) as the addressed cell $M_{i,j}$ 262, or cells that are coupled to adjacent word lines (not shown) and adjacent bit lines as the addressed cell $M_{i,j}$ 262, or any other cells sufficiently coupled to the addressed cell $M_{i,j}$ 262 such that a read or write operation can cause a disturb condition at the addressed cell $M_{i,j}$ 262, or any combination thereof.

In some implementations, some of the components of FIG. 2 can be combined. In various designs, one or more of the components of FIG. 2 (alone or in combination), other than the memory array 210, can be thought of as a managing circuit. For example, one or more managing circuits may include any one of or a combination of the control circuitry 208, the state machine 222, the decoders 212 and 214, the current control module 218, the read/write circuitry 216, the controller 206, any other circuit or functional element, or any combination thereof.

Figure 3:
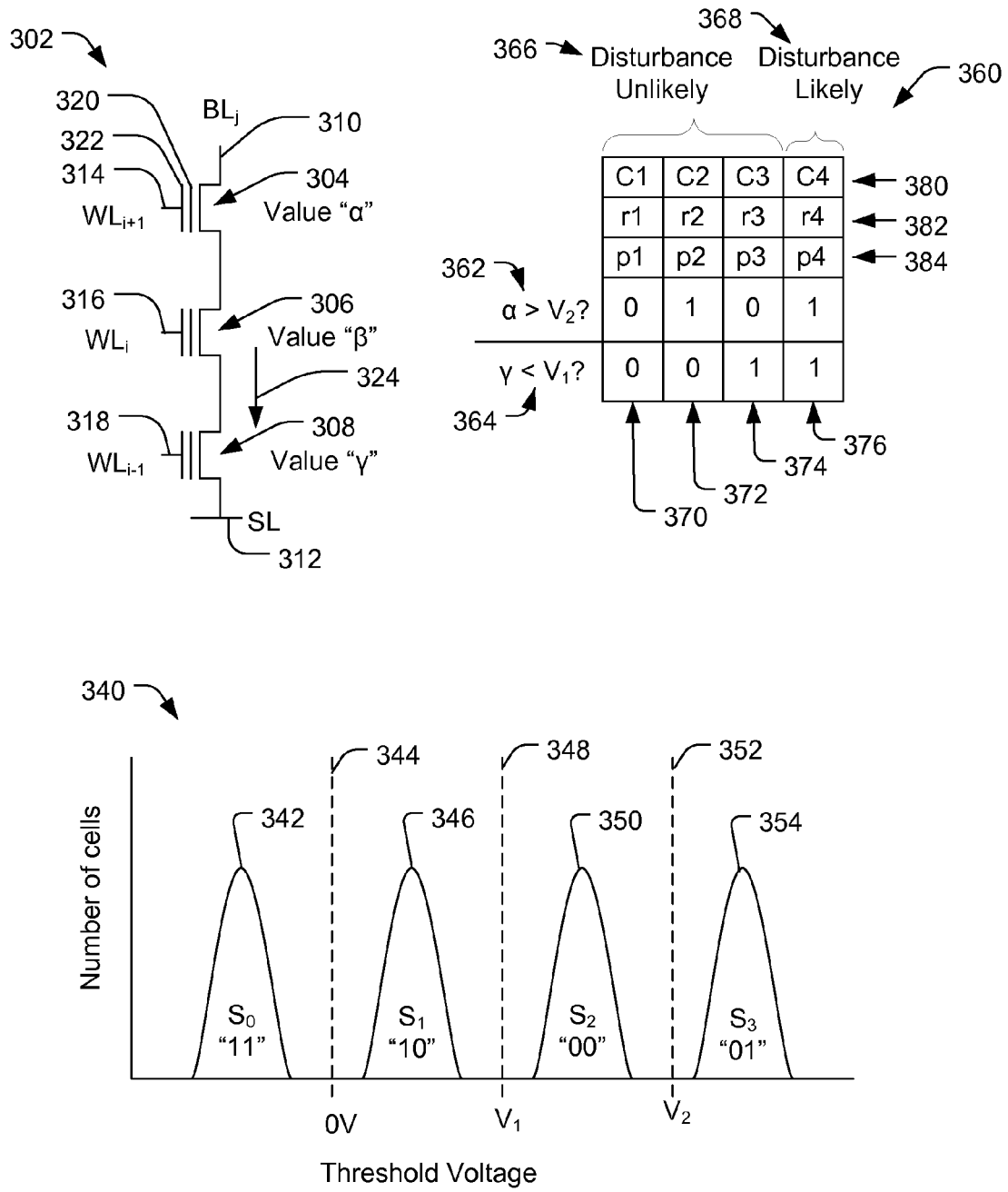
FIG. 3 is a diagram illustrating a particular embodiment of classifying whether a particular cell is prone to a disturb error.

FIG. 3 is a diagram illustrating a particular embodiment of classifying whether a particular cell is prone to a disturb error. FIG. 3 illustrates a representative NAND string 302 that includes an addressed memory cell 306, states 340 of the addressed cell 306, and a set of patterns 360 to classify the joint states of neighbor cells 304 and 308 of the addressed cell 306.

The NAND string 302 includes the cells 304, 306, and 308 coupled to a common bit line $BL_j$ 310. Each cell includes a transistor having a floating gate and a control gate, such as a floating gate 320 and a control gate 322 of the neighbor cell 304. The control gate of each of the cells 304, 306, and 308 is coupled to sequential word lines WL(i+1) 314, WL(i) 316, and WL(i−1) 318, respectively. Each of the cells 304, 306, and 308 can be independently read based on a value of a read current 324 that is responsive to voltages at the common bit line $BL_j$ 310, a source line (SL) 312, and the word line of the addressed bit cell, such as WL(i) 316. As illustrated, the cells 304, 306, and 308 have the values α, β, and γ, respectively. Although the NAND string 302 is depicted as having three transistors, in other embodiments the NAND string 302 may include more than three transistors or less than three transistors.

The states 340 of the addressed cell 306 include a first range 342 of threshold voltage values corresponding to a first state $S_0$, a second range 346 of threshold voltage values corresponding to a second state $S_1$, a third range 350 of threshold voltage values corresponding to a third state $S_2$, and a fourth range 354 of threshold voltage values corresponding to a fourth state $S_3$. The ranges 342, 346, 350, and 354 are defined by a first reference voltage level 344, illustrated as zero volts, a second reference voltage level $V_1$ 348, and a third reference voltage level $V_2$ 352. Although illustrated as four states defined by three reference voltages, in other embodiments the states 340 of the addressed cell 306 may have at least two states defined by at least one reference voltage, or at least three states defined by at least two reference voltages, or any other number of states. In addition, the states 340 also depict data values corresponding to states of the neighbor cells 304 and 308.

The states $S_0$-$S_3$ are based on a threshold voltage of the transistor of a cell, which in turn is affected by an amount of charge stored at the floating gate of the transistor. The threshold voltage may be determined based on a magnitude of the read current 324. In a particular embodiment, the first state $S_0$ is illustrated as corresponding to a "11" data value, the second state $S_1$ to a "10" data value, the third state $S_2$ to a "00" data value, and the fourth state $S_3$ to a "01" data value. However, in other embodiments, one or more of the states may correspond to a different data value.

The set of patterns 360 illustrate a particular embodiment of classifying the joint states of neighbor cells 304 and 308 of the addressed cell 306. The set of patterns 360 includes a first pattern 370, a second pattern 372, a third pattern 374, and a fourth pattern 376. The first pattern 370 may correspond to a first class C1, with a corresponding reliability measure r1 where the first pattern 370 is correlated to a probability p1 of a disturb condition at the addressed cell 306. The second pattern 372 may correspond to a second class C2, with a corresponding reliability measure r2 where the second pattern 372 is correlated to a probability p2 of a disturb condition at the addressed cell 306. The third pattern 374 may correspond to a third class C3, with corresponding reliability measure r3 where the third pattern 374 is correlated to a probability p3 of a disturb condition at the addressed cell 306. The fourth pattern 376 may correspond to a fourth class C4, with a corresponding reliability measure r4 where the forth pattern 376 is correlated to a probability p4 of a disturb condition at the addressed cell 306. The classes C1, C2, C3, and C4 may form a set of four distinct classes 380. The reliability measures r1, r2, r3, and r4 may form a set of four distinct reliability measures 382, and the probabilities p1, p2, p3, and p4 may form a set of distinct probability values 384.

In a particular embodiment, instead of each pattern 370-376 representing a distinct class C1-C4 of the set of distinct classes 380, the set of patterns 360 is classified into a first class 366 indicating that a disturbance at the addressed cell 306 is unlikely and into a second class 368 indicating that a disturbance is likely. In other embodiments, the first class 366 may indicate that a probability of a disturbance at the addressed cell 306 is below a predetermined probability and the second class 368 is at or above the predetermined probability. As illustrated, each of the probabilities p1, p2, and p3 may be less than the predetermined probability and may correspond to the first class 366 while p4 may be greater than the predetermined probability and may correspond to the second class 368. Illustrative, non-limited examples of the predetermined probability include 1%, 5%, 10%, 30%, 50%, or any other probability. In another embodiment, the first class 366 may correspond to a negligible probability of disturbance and the second class 368 may correspond to a non-negligible probability of disturbance.

The patterns 360 are illustrated as based on the values α and γ of the neighbor cells 304 and 308 respectively. However, in other embodiments, one or more of the patterns 360 may be further based on the value β of the addressed cell 306. In addition, although the patterns 360 are illustrated as based on the states of two neighbor cells, in other embodiments one or more of the patterns 360 may be based on one neighbor cell, three neighbor cells, or any other number of neighbor cells. Such neighboring cells may be any cell in the array and not necessarily a cell in near proximity to the target cell.

Determining whether the joint states associated with the values α and γ match a particular pattern of the set of patterns 360 includes performing a first comparison 362 and a second comparison 364. The first comparison 362 determines whether the neighbor cell 304 has a threshold voltage greater than a first predetermined amount, such as $V_2$. The second comparison 364 determines whether the neighbor cell 308 has a threshold voltage less than a second predetermined amount, such as $V_1$. A binary value of "1" (e.g., the condition is satisfied) or "0" (e.g., the condition is not satisfied) may be determined for each comparison. The combination of binary values may be compared to the set of patterns 360 to determine which particular pattern matches the joint states.

For example, the first pattern 370 includes a binary vector <0,0> that is matched when the neighbor cell 304 has a threshold value that is greater than $V_2$, and the neighbor cell 308 has a value that is not less than $V_1$. The first pattern 370 is in the first class 366, indicating that a disturbance to the state of the addressed cell 306 is unlikely. As illustrated, only the fourth pattern 376 that includes the binary vector <1,1> is in the second class 368 that corresponds to a likely disturbance of the state of the addressed cell, where both the neighbor cell 304 has a threshold value that is greater than $V_2$ and the neighbor cell 308 has a value that is less than $V_1$. Such conditions may be empirically determined to correlate to a disturbance of the state of the addressed cell 306.

Although the set of patterns 360 is depicted as including a separate pattern to represent each possible outcome of the comparisons 362 and 364, in other embodiments the set of patterns may include additional patterns 360 that include additional or alternate comparisons. For example, the set of patterns 360 may include patterns based on a third and fourth test corresponding to states of neighbor cells coupled to word line WL(i) 316 at adjacent bit lines. Any other combination of comparisons of states of any number of neighbor cells that are determined to correlate to a disturb condition at a particular cell, or determined to not correlate to a disturb condition at the particular cell, may be included in the set of patterns 360. In addition, in other embodiments the set of patterns 360 may include only patterns correlating to a disturb condition for comparison purposes. In such embodiments, a match of any pattern would indicate a disturb condition, while a failure to match any pattern would indicate a non-disturb condition.

Figure 4:
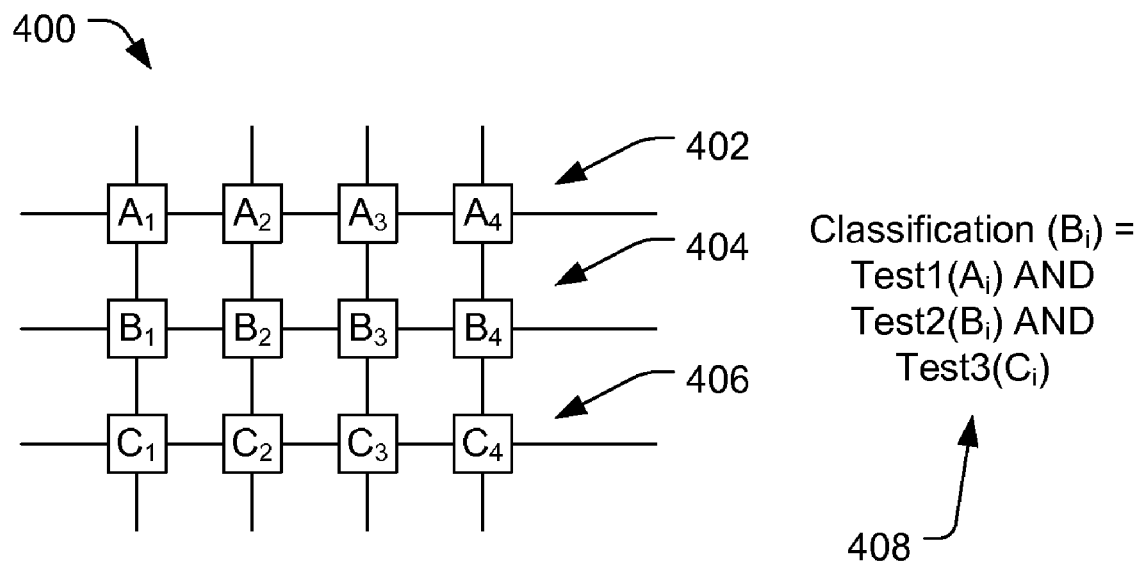
FIG. 4 is a diagram illustrating a particular embodiment of classifying whether individual cells of multiple addressed cells are prone to a disturb error.

FIG. 4 is a diagram illustrating a particular embodiment of classifying whether individual cells of multiple addressed cells are prone to a disturb error. A memory array 400 includes an addressed set of cells $B_1$-$B_4$ 404 coupled to a particular word line. The memory array 400 also includes a plurality of cells adjacent to the addressed set of cells $B_1$-$B_4$ 404, including a first set of neighbor cells $A_1$-$A_4$ 402 and a second set of neighbor cells $C_1$-$C_4$ 406.

The addressed set of cells $B_1$-$B_4$ 404 may be read during a read operation, and the states of the first set of neighbor cells $A_1$-$A_4$ 402 and the second set of neighbor cells $C_1$-$C_4$ 406 may be read for disturb error testing, such as by the control circuit 112 of FIG. 1 or the controller 206 of FIG. 2. A memory state of each cell of the addressed set of cells $B_1$-$B_4$ 404 may be associated with at least one corresponding cell of the first set of neighbor cells $A_1$-$A_4$ 402 or the second set of neighbor cells $C_1$-$C_4$ 406, or both.

For example, where disturb conditions are determined to only occur due to read or write operations at memory cells coupled to same bit line and adjacent word lines, $B_2$ may be associated with $A_2$ and $C_2$. As another example, where disturb conditions are determined to be possible due to read or write conditions at memory cells coupled to the same bit line and adjacent word lines, and at memory cells coupled to adjacent bit lines and the same word lines, $B_2$ may be associated with $A_2$, $C_2$, $B_1$, and $B_3$. As yet another example, where disturb conditions are determined to also be possible due to read or write operations at memory cells coupled to an adjacent word line and an adjacent bit line, $B_2$ may be associated with $A_1$, $A_2$, $A_3$, $B_1$, $B_3$, $C_1$, $C_2$, and $C_3$.

A vector 408 of classification values may be generated related to the classifications of each of the addressed set of cells $B_1$-$B_4$ 404. For example, where the joint states of $A_i$, $B_i$, and $C_i$ are sufficient to determine a probability of a disturb condition at $B_i$, (where i=1, 2, 3, 4 . . . ) a first test may be performed on the state of $A_i$, (Test1($A_i$)), a second test may be performed on the state of $B_i$ (Test2($B_i$)), and a third test may be performed on the state of $C_i$ (Test3($C_i$)). The corresponding value of the vector 408 (Classification($B_i$)) may indicate the satisfaction of all three tests, i.e., a logical one value indicating a potential disturb error at the particular cell when all three tests are satisfied, or a logical zero value indicating no potential disturb error when at least one test is not satisfied. The vector 408 can be used to indicate potential disturb errors in the readings of the addressed set of cells $B_1$-$B_4$ 404. For example, the vector 408 may be provided to the ECC decoder 244 via the reliability indicator 262 of FIG. 2.

In conjunction with the systems and explanations depicted and described with respect to FIGS. 1-4, in a particular embodiment, when estimating data that has been stored in a particular cell which is known to be sensitive to a program disturb, or to a read disturb, or both, or any other disturb on flash cells, the following can be performed:

a. A reading operation is performed on the particular cell, and a number of neighboring cells, whose values (e.g. threshold voltage) may be in correlation with a certain property of the particular cell, such as neighboring cells with high state.

b. The values read from each cell are associated with a state of the cell; for example in a sixteen level flash memory, each value is associated with one of sixteen states.

c. The joint states of a reading are determined as the states of the cell and its associated neighbors.

d. The set of all possible joint states of a reading operation can be partitioned into a number of classes, each of the classes associated with a different property. For example, the set of all possible joint states may be determined offline as patterns of a first class associated with a non-disturb event or of a second class associated with a disturb event, such as the first class 366 and the second class 368 of the set of patterns 360 of FIG. 3.

e. The data that is stored in the cell is estimated, as a function of the class of the joint states.

In another embodiment, the readings of the cells are done with a resolution that is higher than the resolution of the states:

a. A reading operation is performed on the cell, and a number of neighboring cells whose values may be in correlation with a certain property of the desired cell, such as neighboring cells with high state.

b. The set of all possible joint values of reading operation can be partitioned into a number of classes, each of the classes associated with a different property.

c. The data that is stored in the cell can be estimated as a function of the class of the joint values.

For example, an addressed cell may read together with two neighboring cells, such as neighboring cells on the same bit line but not the immediate nearest neighbors. This scenario may depend on the pattern formed on the bit line which creates the classes. The set of joint values (e.g. a vector of the three readings) is partitioned into two classes according to the property: (i) the class of values which are in correlation with a disturb event; and (ii) the class of values which are in correlation with a non-disturb event.

In other words, if a vector of joint readings belongs to class (i), then the desired cell has a high probability of being subject to a disturb event, and its value may have a high probability of requiring adjustment, and therefore should be adjusted, while if a vector of joint readings belongs to class (ii), then the desired cell has a low probability of being subject to a disturb event, and its value remains unmodified.

In a "soft" variation, in the first case a low reliability measure is associated with the desired cell reading as the read result less accurately represents the programmed state of the designated cell as a result of the association of the cell with the particular class. In the second case a higher reliability measure is associated with the desired cell reading, as this reading better represents the programmed state of the designated cell.

These reliability measures can then be employed to feed a soft input ECC decoder for which the decoding operation is improved upon better reliability estimates, thus its error correction capability is increased. Otherwise if the cells are not classified into groups, then the average reduced reliability estimates may be fed into all bits representing the data stored in the set of cells, which may affect a correction capability of a soft input ECC decoder.

A more detailed example may include:

a. Reading cells in a designated WL(n) of a multi-level cell (MLC) programmed device associating a reliability measure to each set of bits stored in each cell of WL(n) according to the read threshold voltage of each cell.

b. Reading a neighboring WL(n+j) such that j>0, then reading neighboring WL(n−k) such that k>0.

c. Computing a binary vector for WL(n+j) in which each cell in WL(n+j) has a corresponding binary value that represents a first logical function applied to the cell. For example, the logical function could be that the read threshold level in the cell is above three volts.

d. Computing a binary vector for WL(n−k) in which each cell in WL(n−k) has a corresponding binary value that represents a second logical function applied to the cell.

e. The first and second logical function may or may not be different. For example, the second logical function could be that the read threshold level in the cell is below one volt.

f. Computing a bit by bit AND operation on the two binary vectors, resulting in a flag vector being generated.

g. For each cell in WL(n) with associated "1" (e.g., a logical one value) in the flag vector, modifying the corresponding reliability measure for the cell.

h. Feeding an ECC decoder with the modified reliability measures.

i. Activating the ECC decoder to decode bits stored in cells of designated WL(n) using the modified reliability measures.

Another detailed example may include:

a. Reading cells in a designated WL(n) of a multi-level cell (MLC) programmed device associating a reliability measure to each set of bits stored in each cell of WL(n) according to the read threshold voltage of each cell.

b. Reading a neighboring WL(n+j) such that j>0 c. Computing a binary flag vector for WL(n+j) in which each cell in WL(n+j) has a corresponding binary value that represents a logical function applied to the cell. For example, the logical function could be that the read threshold level in the cell is above three volts.

g. For each cell in WL(n) with associated "1" (e.g., a logical one value) in the flag vector, modifying the corresponding reliability measure for the cell.

h. Feeding an ECC decoder with the modified reliability measures.

i. Activating the ECC decoder to decode bits stored in cells of designated WL(n) using the modified reliability measures.

Another example related to a single-level cell (SLC) system may include:

a. Reading cell in a designated WL(n) of a flash device programmed in an SLC scheme associating a reliability measure to each bit (stored separately in each cell) of WL(n) according to the read threshold voltage of each cell.

b. Computing a binary flag vector for WL(n+j) in which each cell in WL(n+j) has a corresponding binary value that represents a first logical function applied to each cell in WL(n+j). The logical function could be that the read threshold level in each cell is below five volts and above four volts.

c. For each cell in WL(n) with associated "1" in the flag vector, modifying a corresponding LLR reliability measure such that it is reduced by a factor of two.

d. Feeding an ECC decoder with modified reliability measures.

e. Activating the ECC decoder to decode bits stored in cells of designated WL(n) using the modified reliability measures.

As another example, a set of multiple desired cells and multiple neighboring cells may be read, and the joint reading may be partitioned into two or more classes, each class associated with a certain property of the multiple desired cells. The definition of the classes can either be performed as part of an offline process in which the flash memory device is analyzed and the correlations are studied.

For example, for a particular flash technology, in a particular embodiment, cells that are more prone to a program disturb may be identified by:

a. Performing a binary reading of WL(n−4) and identifying cells having a threshold voltage less than or equal to a first reference voltage. Denote the read binary page as P(n−4).

b. Performing a binary reading of WL(n+4) and identifying cells for which the threshold voltage is greater than or equal to a second reference voltage that is less than the first reference voltage. Denote the read binary page as P(n+4).

c. Generating P=P(n−4) AND P(n+4). Every cell corresponding to a "1" in P may be identified as a cell of WL(n) that is more prone to a program disturb. Every cell corresponding to a "0" in P may be identified as a cell of WL(n) that is less prone to a program disturb.

Figure 5:
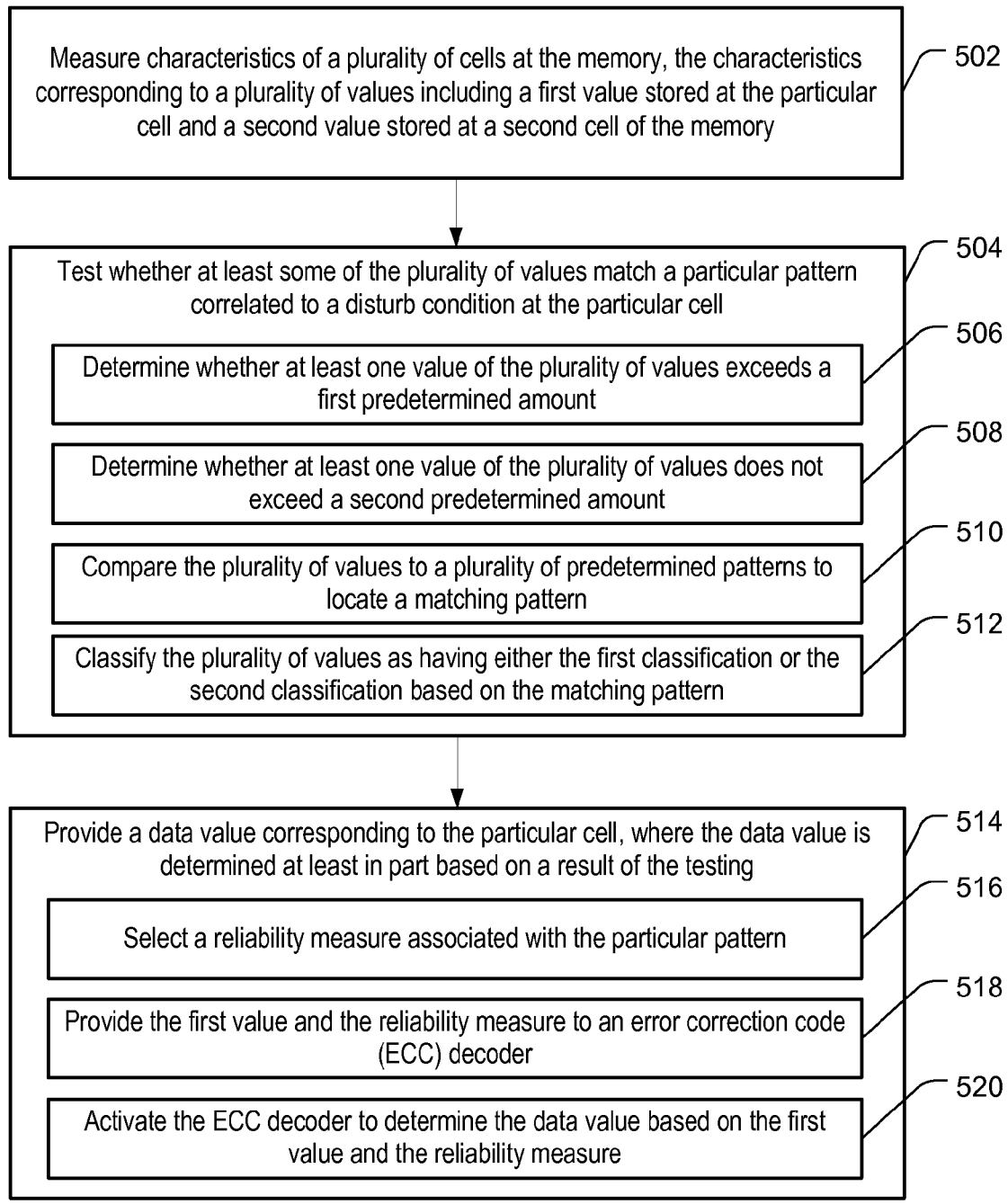
FIG. 5 is a flow diagram of a particular embodiment of a method of determining a data value stored at a particular cell of a memory.

FIG. 5 is a flow diagram of a particular embodiment of a method of determining a data value stored at a particular cell of a memory, such as a flash memory. In an illustrative embodiment, the method may be implemented at the memory device 102 of FIG. 1 or the memory device 202 of FIG. 2.

Characteristics are measured of a plurality of cells at the memory, the characteristics corresponding to a plurality of values including a first value stored at the particular cell and a second value stored at a second cell of the memory, at 502. For example, the characteristics may include a magnitude of a read current indicating a threshold voltage due to a level of charge at a floating gate of each cell of a plurality of cells. The first cell may be coupled to a particular bit line and to a particular word line, and the second cell may be coupled to the particular bit line and to a second word line. The plurality of values may also include a third value stored at a third cell of the memory. The third cell may also be coupled to the particular bit line and to a third word line such that the first word line is located between the second word line and the third word line.

Continuing to 504, testing whether at least some of the plurality of values match a particular pattern correlated to a disturb condition at the particular cell is performed. For example, the disturb condition may be a read disturb condition or a program disturb condition. The particular pattern may be empirically determined to indicate the disturb condition. For example, the particular pattern may be one of the read disturb patterns 250 or program disturb patterns 252 of FIG. 2. In an illustrative embodiment, the testing may be performed by a memory control element, such as the disturb error tester 114 of the control circuit 112 of FIG. 1 or the processor 240 of the controller 206 of FIG. 2, as illustrative, non-limiting examples.

The testing may identify a risk of the first value having the disturb condition without determining cross-coupling coefficients. For example, the disturb condition may indicate that a probability of an error in the first value due to a data write operation occurring at the second cell is greater than a predetermined probability. The predetermined probability may be at least partially based on a capability of an error correction circuit, such as the ECC decoder 244 of FIG. 2, to identify and correct erroneous values. For example, the predetermined probability may be set at one-half of one percent, one or two percent, five percent, ten percent, or twenty percent, or fifty percent, as illustrative, non-limiting examples.

The testing may include determining whether at least one value of the plurality of values exceeds a first predetermined amount, at 506. The testing may include determining whether at least one value of the plurality of values does not exceed a second predetermined amount, at 508.

The testing may include comparing the plurality of values to a plurality of predetermined patterns to locate a matching pattern, at 510. A first predetermined pattern of the plurality of predetermined patterns may correspond to a first classification that indicates the disturb condition, and a second predetermined pattern of the plurality of predetermined patterns may correspond to a second classification not indicating the disturb condition. The testing may also include classifying the plurality of values as having either the first classification or the second classification based on the matching pattern, at 512. In other embodiments, three or more predetermined patterns may be correlated with corresponding probabilities of the disturb condition. For example, the first predetermined pattern may correspond to a probability of a disturb error that is greater than a first threshold, the second predetermined pattern may correspond to a probability of a disturb error that is less than a second threshold, and a third predetermined pattern of the plurality of predetermined patterns may correspond to a probability of the disturb error that is not greater than the first threshold and not less than the second threshold. Therefore, the first predetermined pattern may correspond to a first classification, the second predetermined pattern may correspond to a second classification, and the third predetermined pattern may correspond to a third classification. Each predetermined pattern or classification may be associated with a corresponding reliability measure, such as the reliability measures r1-r4 of the set of reliability measures 382 of FIG. 3.

Advancing to 514, a data value corresponding to the particular cell is provided, where the data value is determined at least in part based on a result of the testing. For example, providing the data value may include selecting a reliability measure associated with the particular pattern, at 516, providing the first value and the reliability measure to an error correction code (ECC) decoder, at 518, and activating the ECC decoder to determine the data value based on the first value and the reliability measure, at 520.

Figure 6:
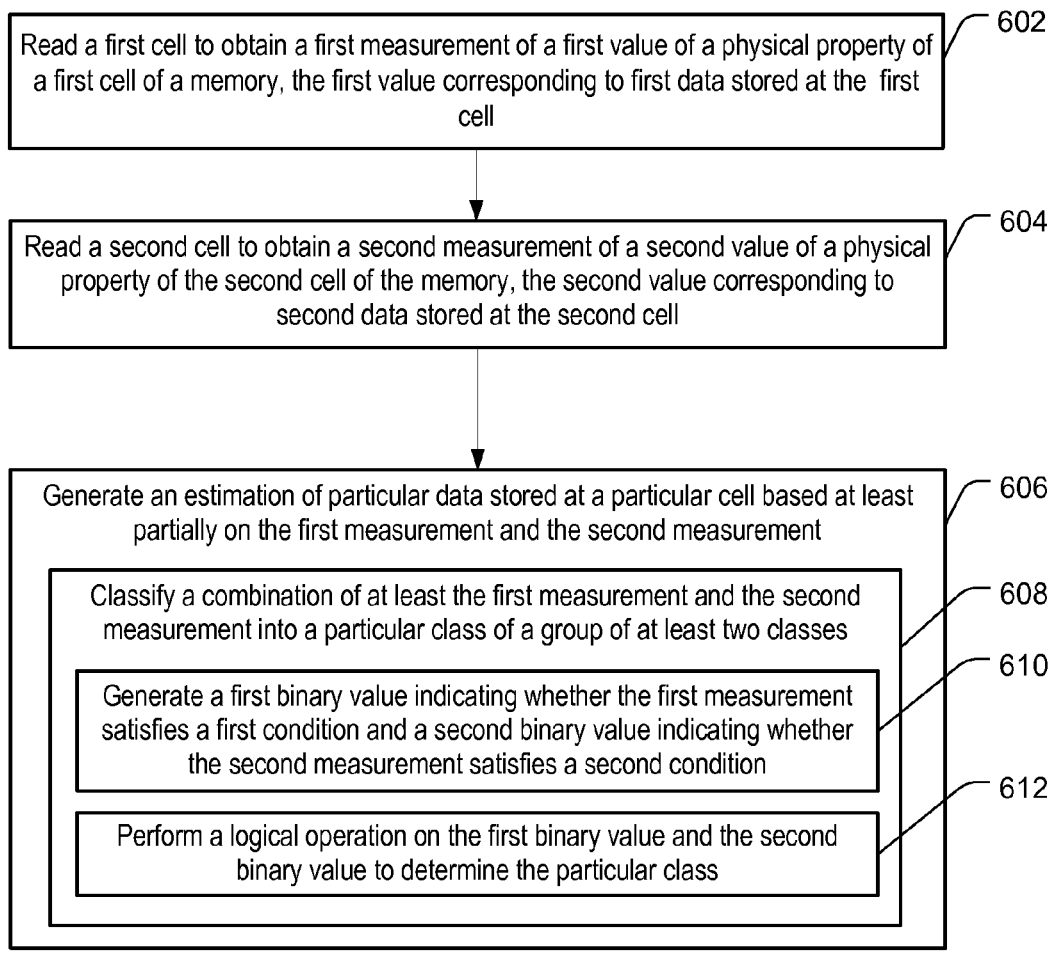
FIG. 6 is a flow diagram of a particular embodiment of a method of reading data stored at a particular cell of a memory.

FIG. 6 is a flow diagram of a particular embodiment of a method of reading data stored at a particular cell of a memory, such as a flash memory. In an illustrative embodiment, the method may be implemented at the memory device 102 of FIG. 1 or the memory device 202 of FIG. 2.

The method includes reading a first cell to obtain a first measurement of a first value of a physical property of a first cell of a memory, the first value corresponding to first data stored at the first cell, at 602. Moving to 604, a second cell is read to obtain a second measurement of a second value of a physical property of the second cell of the memory, the second value corresponding to second data stored at the second cell. In a particular embodiment, the first cell and the second cell are flash cells. The physical property of the first cell may be a threshold voltage of the first cell, and the physical property of the second cell may be a threshold voltage of the second cell.

Proceeding to 606, an estimation of particular data stored at a particular cell is generated based at least partially on the first measurement and the second measurement. Generating the estimation includes classifying a combination of at least the first measurement and the second measurement into a particular class of a group of at least two classes, at 608. At least one class of the group of at least two classes is a class of combination measurement values that are determined to correlate to the particular cell being prone to a disturb error. For example, the disturb error may include a programming-time disturb error or a read-time disturb error.

In a particular embodiment, the particular cell is the first cell. The second cell may be at a location within the memory relative to the particular cell such that a data write to the second cell can potentially disturb a value of a physical property of the particular cell. For example, the measurements of the second cell and the first cell may be determined to satisfy conditions correlated to the first cell being prone to a program disturb. In another embodiment, the first cell and the second cell are neighbor cells to the particular cell. For example, the first cell and the second cell may be at locations within the memory relative to the particular cell such that a data write to the first cell, the second cell, or both, can potentially disturb a value of a physical property of the particular cell. In yet another embodiment, the first cell and the second cell are neighboring cells to the particular cell, and the particular cell is read to obtain a third measurement of a third value of a physical property of the particular cell. The third measurement may also be included in the combination. Thus, in some embodiments, the classification may be determined based on measurements of the particular cell and one or more neighbor cells, while in other embodiments the classification may be determined based on measurements of one or more neighbor cells and not the particular cell. At least one of the neighbor cells may be coupled to the same bit line as the particular cell and to a different word line than the particular cell.

Classifying the combination of at least the first measurement and the second measurement may include generating a first binary value indicating whether the first measurement satisfies a first condition and a second binary value indicating whether the second measurement satisfies a second condition, at 610. The classifying may also include performing a logical operation on the first binary value and the second binary value to determine the particular class, at 612. In another embodiment, a vector may be generated that includes a first binary value that indicates whether the first measurement satisfies a first condition and a second binary value that indicates whether the second measurement satisfies a second condition. Each of four possible values of the vector may represent a corresponding class of four distinct classes, and each distinct class may be associated with a corresponding reliability measure. A particular reliability measure of the particular data may be determined based on a class represented by the vector, and the particular reliability measure may be provided to an error correction code (ECC) decoder.

Figure 7:
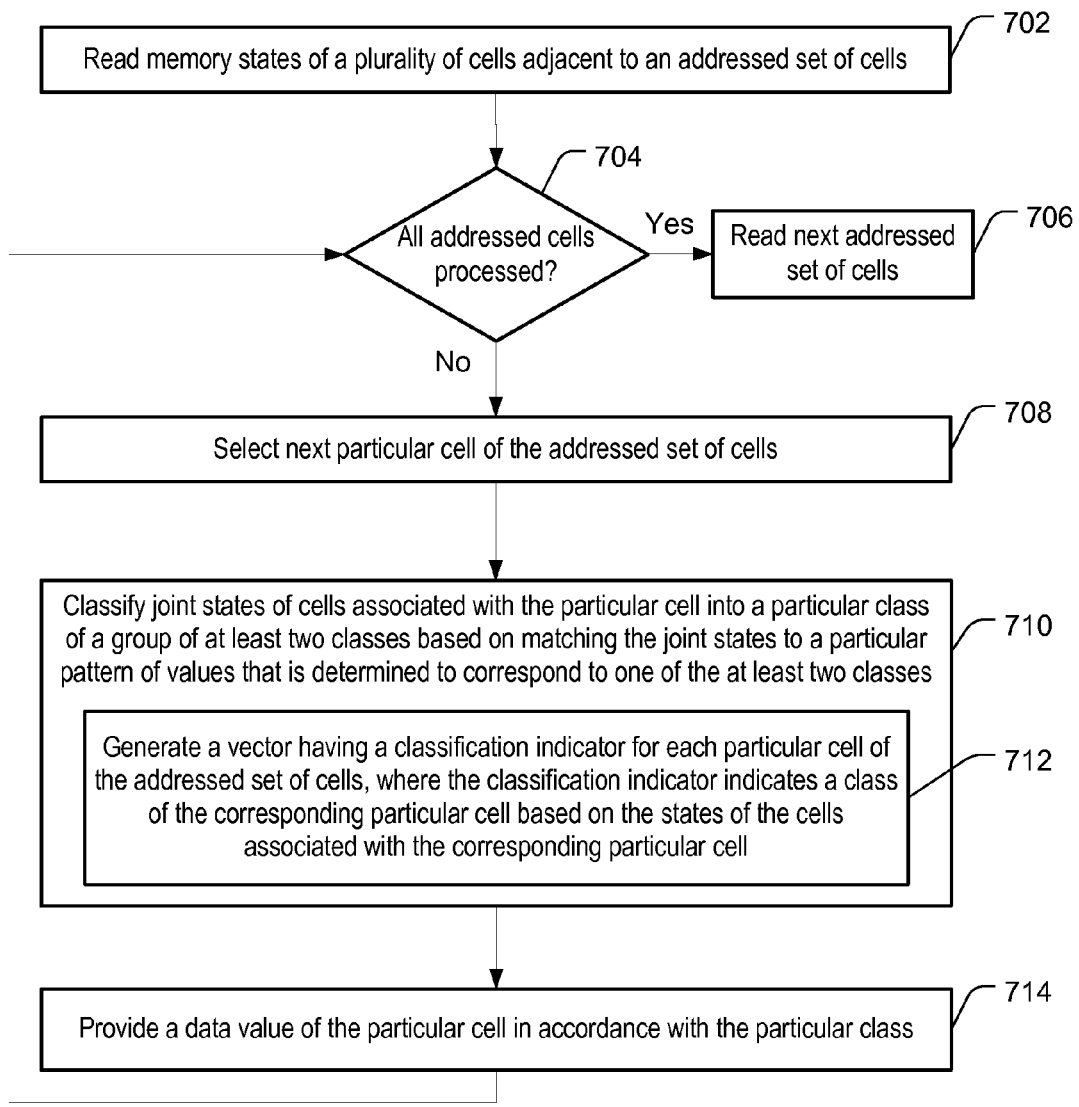
FIG. 7 is a flow diagram of a particular embodiment of a method of providing a data value of each cell of an addressed set of cells of a memory.

FIG. 7 is a flow diagram of a particular embodiment of a method of providing a data value of each cell of an addressed set of cells of a memory. In an illustrative embodiment, the method is performed in a flash device that includes an array of memory cells and a circuit to read states of multiple memory cells and to compare the read states to at least two reference voltage levels defining at least three memory state ranges.

Memory states of a plurality of cells adjacent to an addressed set of cells are read, at 702. A memory state of each cell of the addressed set of cells is associated with at least one corresponding cell of the plurality of cells. For example, the addressed set of cells may be the addressed set of cells 404 of FIG. 4, and the plurality of cells adjacent to the addressed set of cells may be first set of neighboring cells 402, the second set of neighboring cells 406, or any combination thereof.

Advancing to decision 704, a determination may be made whether all cells of the addressed set of cells has been processed. When all cells of the addressed set of cells have been processed, a next addressed set of cells may be read, at 706. Otherwise, a next particular cell of the addressed set of cells may be selected, at 708, until each particular cell of the addressed set of cells has been processed.

Moving to 710, joint states of cells associated with the particular cell are classified into a particular class of a group of at least two classes based on matching the joint states to a particular pattern of values that is determined to correspond to one of the at least two classes. At least one class of the group of at least two classes may indicate a correlation between the joint states of the cells associated with the particular cell and the particular cell being prone to a programming disturb, in one example, or a read disturb, in another example. The classifying may include generating a vector having a classification indicator for each particular cell of the addressed set of cells, where the classification indicator indicates a class of the corresponding particular cell based on the states of the cells associated with the corresponding particular cell, at 712. For example, where the group includes more than two classes, each classification indicator may be represented by an integer, a multi-bit binary number or binary vector, or other representation of three or more values. When the group does not include more than two classes, the classifying may instead include generating a vector having a binary value for each particular cell of the addressed set of cells, where the binary value indicates whether the states of the cells associated with the corresponding particular cell are classified under the first class.

Proceeding to 714, a data value of the particular cell may be provided in accordance with the particular class. For example, the data value may be based on the read memory state of the particular cell and further based on the particular class. To illustrate, when the particular class indicates the particular cell is prone to a disturb error, a further error detection and correction process may be implemented that is not implemented when the particular class indicates the particular cell is not prone to a disturb error. As a further example, when three or more classes are used, each of the values in the vector may be mapped to one of the classes which in turn may determine a reliability measure of the addressed cell, where each class represents a different reliability measure, or a different probability for the cell to be prone to a disturb event, than the other classes.

Figure 8:
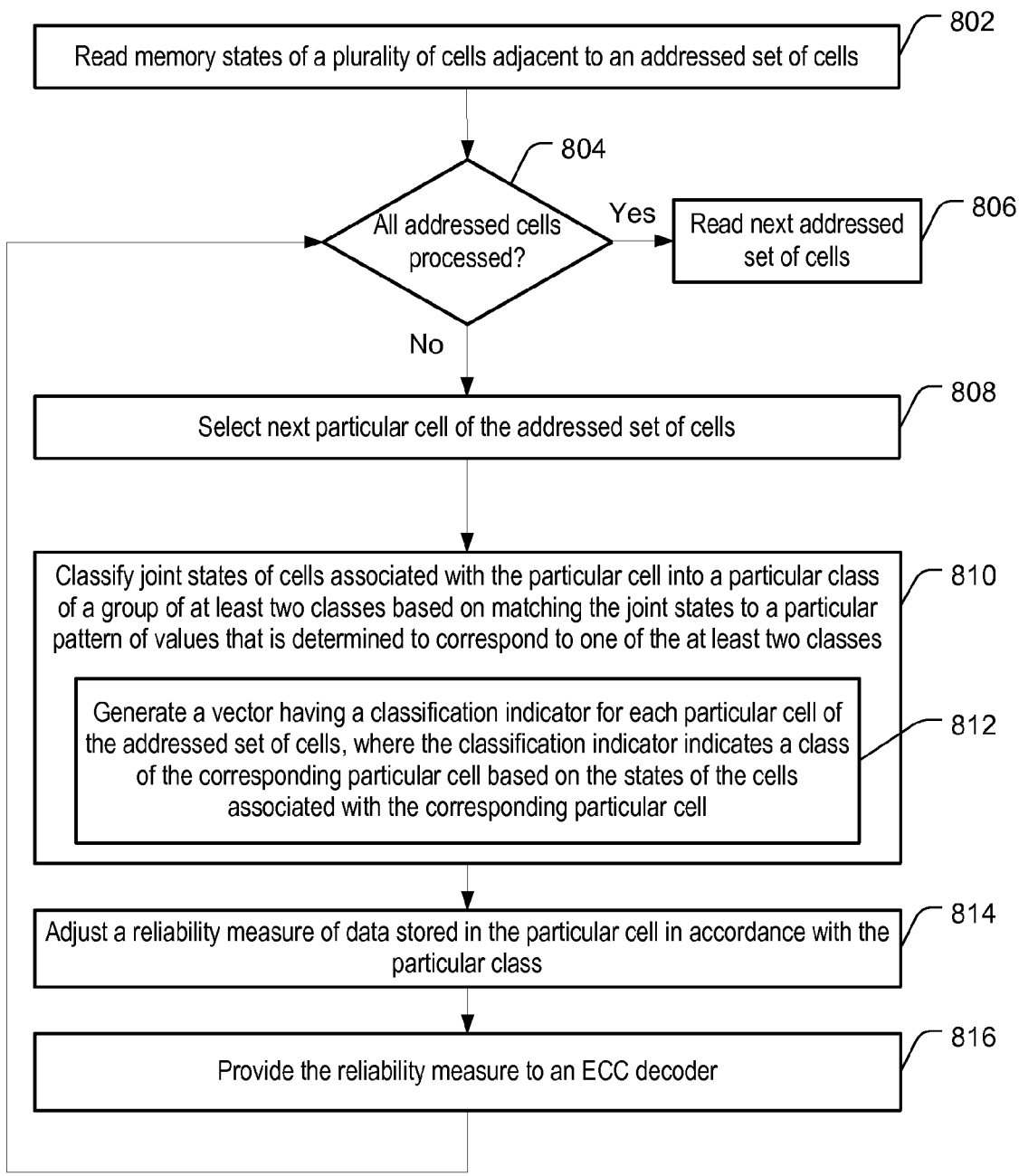
FIG. 8 is a flow diagram of a particular embodiment of a method of reading data of each cell of an addressed set of cells of a memory.

FIG. 8 is a flow diagram of a particular embodiment of a method of reading data of each cell of an addressed set of cells of a memory. In an illustrative embodiment, the method is performed in a flash device that includes an array of memory cells and a circuit to read states of multiple memory cells and to compare the read states to at least two reference voltage levels defining at least three memory state ranges.

Memory states of a plurality of cells adjacent to an addressed set of cells are read, at 802. A memory state of each cell of the addressed set of cells is associated with at least one corresponding cell of the plurality of cells. The plurality of cells may include at least two cells sharing a bit line with a corresponding cell of the addressed set of cells. For example, the addressed set of cells may be the addressed set of cells 404 of FIG. 4, and the plurality of cells adjacent to the addressed set of cells may be first set of neighboring cells 402, the second set of neighboring cells 406, or any combination thereof.

Advancing to decision 804, a determination may be made whether all cells of the addressed set of cells has been processed. When all cells of the addressed set of cells have been processed, a next addressed set of cells may be read, at 806. Otherwise, a next particular cell of the addressed set of cells may be selected, at 808, until each particular cell of the addressed set of cells has been processed.

Moving to 810, joint states of cells associated with the particular cell are classified into a particular class of a group of at least two classes based on matching the joint states to a particular pattern of values that is determined to correspond to one of the at least two classes. A first class of the group of at least two classes may indicate a correlation between the joint states of the cells associated with the particular cell and the particular cell being prone to a programming disturb, in one example, or a read disturb, in another example. The determined correlation may be empirically determined. The classifying may include generating a vector having a classification indicator for each particular cell of the addressed set of cells, where the classification indicator indicates a class of the corresponding particular cell based on the states of the cells associated with the corresponding particular cell, at 812. For example, where the group includes more than two classes, each classification indicator may be represented by an integer, a multi-bit binary number or binary vector, or other representation of three or more values. When the group does not include more than two classes, the classifying may instead include generating a vector having a binary value for each particular cell of the addressed set of cells, where the binary value indicates whether the states of the cells associated with the corresponding particular cell are classified under the first class.

Proceeding to 814, a reliability measure of data stored in the particular cell may be adjusted in accordance with the particular class. For example, when three or more classes are used, each of the values in the vector may be mapped to one of the classes which in turn may determine a reliability measure of the addressed cell, where each class may represent a different reliability measure than the other classes. Continuing to 816, the reliability measure may be provided to an error correction code (ECC) decoder. For example, the reliability measure may be provided as the reliability indicator 262 that is provided to the ECC decoder 244 of FIG. 2.

In addition to disturb effects, various physical phenomena occurring in flash memories can result in corruption of information stored in a memory cell. These phenomena include:

1) Programming noises, due to the stochastic nature of the programming process, involving quantum effects such has tunneling and hot electron injection, which are susceptible to charge trapping and detrapping in the cell's oxide layer;

2) Read and verify noises, due to limited precision of the sensing circuitry and susceptibility to random noise and charge trapping and detrapping;

3) Disturbance effects due to programming of neighboring cells; threshold voltage shifting due to cross-coupling with floating gates of neighboring cells, and unintentional or noisy programming of a cell when programming its neighboring cells (e.g. program disturb and Nakamura effects);

4) Charge leakage over time;

5) Wearing of the memory cells due to cycling; and/or

6) Variations in the manufacturing process (e.g. die-to-die variations).

In order to allow reliable operation of a flash memory under these conditions, Error Correction Codes (ECC) are used. More specifically, redundant data may be stored together with the information, allowing one to correct the errors that corrupted the stored information. An efficient ECC decoding scheme for inferring the information stored in a flash memory from the read data provides enhanced error correction capability (i.e. allows inferring the stored information under severe flash memory noise conditions given that a fixed amount of redundant data is used). This allows efficient utilization of the flash memory because a reduced amount of redundancy can be used in order to provide reliable storage under given flash memory noise conditions.

State of the art "soft" ECC decoders can take into account the reliabilities of the initial estimations of the read bits, in order to boost up the error correction capability. More specifically, the read value of the cell is converted into "soft" estimates of its stored bits. Such a "soft" estimate is composed of the bit estimate (i.e. 0 or 1) together with a metric which reflect how reliable is the bit estimate. Properly initializing the decoder with "soft" bit estimates can have a significant effect on the decoder's error correction capability.

A low complexity and flexible method for decoder initialization can be based on the read values of a target cell and its neighbors.

Figure 9:
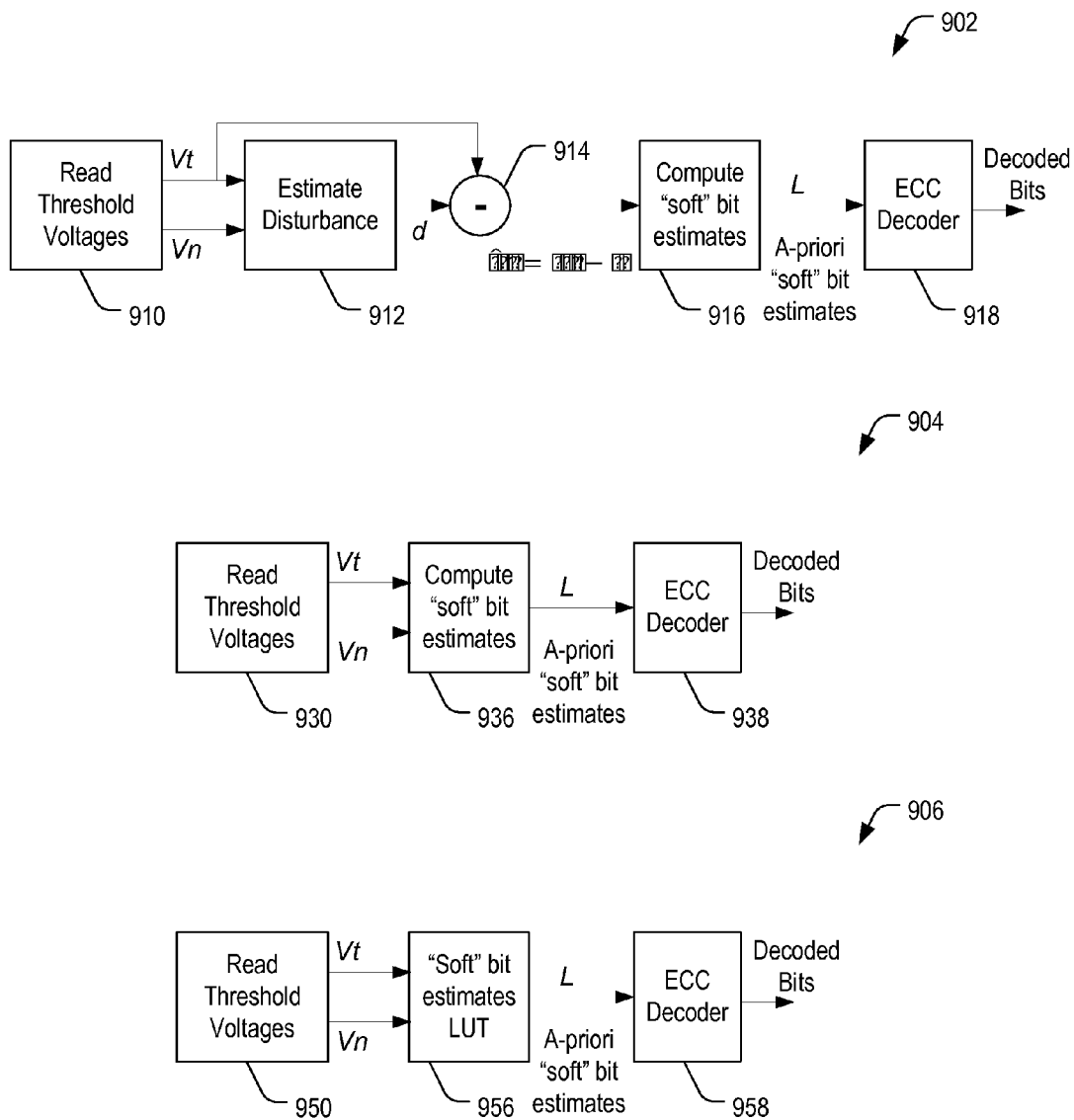
FIG. 9 is a block diagram of embodiments of reading data using reliability measures.

FIG. 9 illustrates embodiments of reading data using reliability measures to initialize an ECC decoder with "soft" bit estimates (L). A first example 902 generates "soft" bit estimates (i.e. a bit value and a reliability measure of the bit value) based on a corrected read value of the target cell ($\hat{V}t$) that is computed by subtracting a disturbance value (d) from the read value of the target cell (Vt). The disturbance value is computed based on the read value of the neighboring cells (Vn) and possibly the read value of the target cell (Vt). Hence, $\hat{V}t=Vt-d$ and L=function ($\hat{V}t$). This approach is illustrated as process 902 of FIG. 9, including reading threshold voltages, at 910, estimating a disturbance value, at 912, subtracting the disturbance value from the target cell threshold voltage, at 914, computing "soft" bit estimates, at 916, and generating decoded bits at an ECC decoder based on the "soft" bit estimates, at 918.

An optimal disturbance estimate (in terms of mean square error) is the expected disturbance given the read values of the neighbor and target cells, i.e. d=E[disturbance|Vn,Vt]. This value can be computed empirically, for each pattern of neighbor states, by measuring read values of a large population of target cells (Vt) at two conditions: first, when their neighboring cells are erased; and second, when their neighboring cells are programmed to the specific pattern of neighbor states. Then, an average change in the read value of the target cells (Vt) between the two measurements constitutes the estimated distortion of the threshold voltage for the specific pattern of neighbor states.

Based on this approach the expected shift in the read value of the target cell due to disturbance from neighboring cells (e.g. due to cross-coupling effects) can be at least partially compensated.

However, various disturbance mechanisms may result in a more involved effect on the target cell, rather than just shifting a threshold voltage of the target cell. For example, a disturbance mechanism known as Nakamura effect results in selective widening (with no shift) of the distribution of the read value of the target cell (Vt) given that the target cell was programmed to a certain state (s) and given that its adjacent left and/or right neighbor cells were programmed to the same state (s). When a target cell and its neighbors are programmed to the same state, the target cell should exhibit noisier programming and hence wider Vt distribution. In the Nakamura disturbance mechanism, the expected read value of the target cell (Vt) given the read value of its neighbor cells is not shifted and hence an initialization method according to the process 902 will not correct the read value (i.e. $\hat{V}t=Vt$ because E[disturbance|Vn,Vt]=0). Hence, the "soft" bit estimates provided to the decoder will be the same regardless of the read values of the neighboring cells. As a result, information is not conveyed to the decoder regarding possible selective widening of the distribution of the read value of the target cell (Vt). An optimal decoder initialization scheme would assign lower reliability to the estimates of the stored bits of a target cell, if the read value of the cell and its adjacent left and/or right neighbors corresponds to the same state (s) compared to the case where the read value of the target cell and its adjacent neighbors correspond to different states.

In a general case, an effect of a certain disturbance mechanism may be described by a conditional probability distribution function specifying the probability of the target cell to be read at each possible read value (Vt) given that the target cell was programmed to each state (s) and given the specific pattern of read values from the neighboring cells (Vn). An effect of the disturbance can be described by specifying Pr(Vt|s; Vn) for every possible Vt, s, and Vn. Based on knowing the described conditional probability distribution function, one can compute optimal initial "soft" bit estimates (theoretically maximizing the ECC decoder's error correction capability). The "soft" bit estimates can be conveyed in various ways, e.g. as probabilities of each stored bit to be 0 or 1, or as Log-Likelihood Ratio's (LLR's) given as the logarithm of a ratio between the probability of the stored bit to be 0 and the probability of the stored bit to be 1. Theoretically, optimal LLR estimates may be given by:

Eq. (1)

$$LLR(b \mid v_t; v_n) = \log \frac{Pr(b=0 \mid v_t; v_n)}{Pr(b=1 \mid v_t; v_n)} = \log \frac{\sum_{s:b=0} Pr(v_t \mid s; v_n)}{\sum_{s:b=1} Pr(v_t \mid s; v_n)} \quad (1)$$

The LLR computation may be performed assuming equal a-priori probabilities for the bit b to be 0 or 1 (i.e. Pr(b=0)=Pr(b=1)). The notation s:b=0/1 used for defining the summation range implies summation over all states s for which bit b in the bit sequence mapped to the state s is 0/1. Based on the above, a decoder initialization scheme is disclosed that provides improvements over the process 902 and that is flexible and simple. The read values of the target cell (Vt) and the neighboring cells (Vn) are translated directly into "soft" bit estimates which are used for decoder initialization. "Directly" translated means that the "soft" bit estimates are generated without computing a disturbance value (e.g. d of process 902) that is added to or subtracted from the read value of the target cell (Vt) for producing a corrected read value (e.g. $\hat{V}t$ of process 902). No corrected read value may be used for generating the "soft" bit estimates.

For example, direct translation of the read values of the target cell and its neighboring cells into LLR "soft" bit estimates can be done according to Eq. (1). Processes 904 and 906 of FIG. 9 illustrate two embodiments that include a decoder initialization scheme that directly computes "soft" bit estimates without computing an offset value (e.g. d of process 902) to be applied to the read value of the target cell (Vt). The process 904 includes reading threshold voltages, at 930, directly computing "soft" bit estimates from the read threshold values, at 936, and generating decoded bits by providing the "soft" bit estimates to an ECC decoder, at 938. The process 906 includes reading threshold voltages, at 950, directly computing "soft" bit estimates from the read threshold values via a pre-computed look up table (LUT) retrieval that directly translates the read threshold voltage values to LLRs, at 956, and generating decoded bits by providing the "soft" bit estimates to an ECC decoder, at 958.

Figure 11:
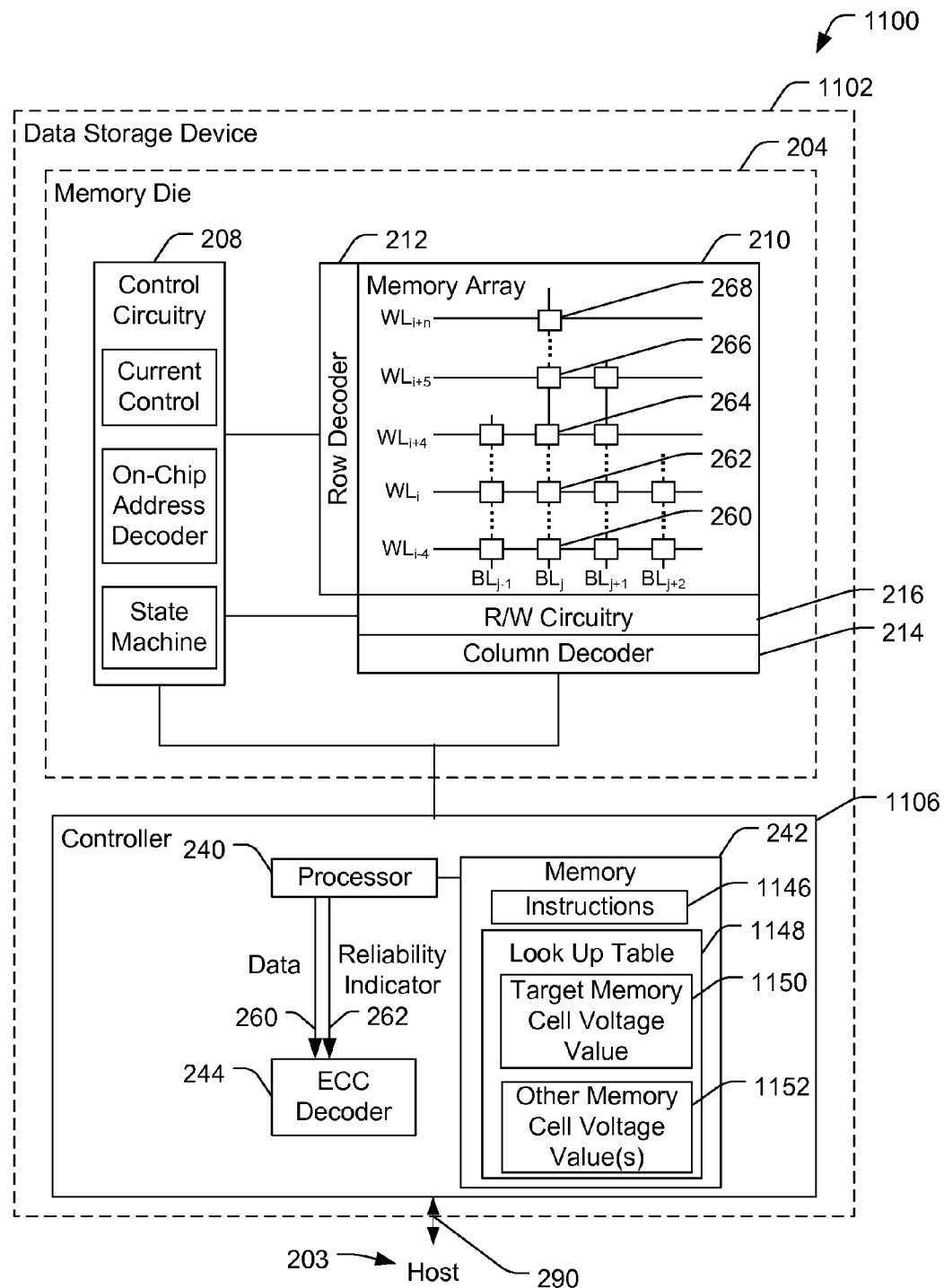
FIG. 11 is a block diagram of a second particular embodiment of a system to read data using a directly computed reliability measure.
Figure 12:
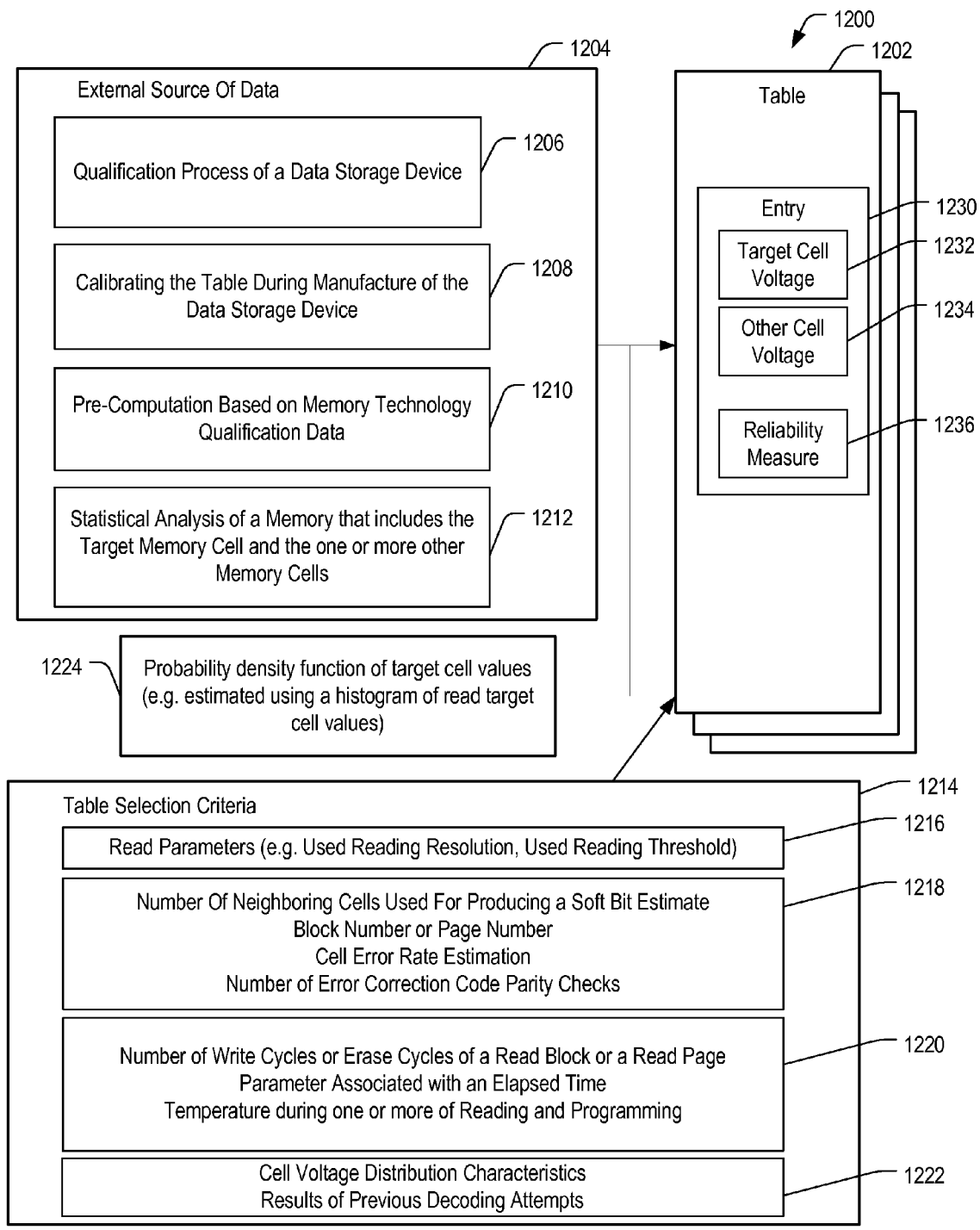
FIG. 12 is a general diagram of a system including a lookup table to directly compute a reliability measure.
Figure 13:
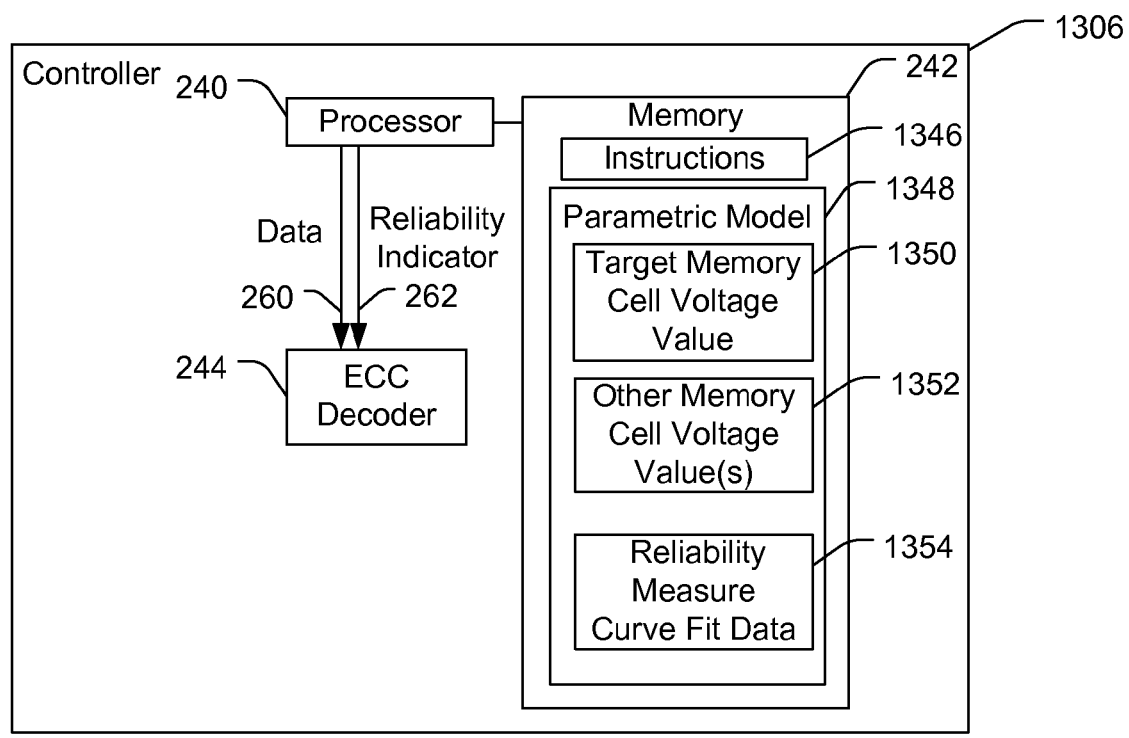
FIG. 13 is a block diagram of a particular embodiment of a controller that can be used in the data storage device of FIG. 11.

The usage of an LUT enables a low complexity implementation that offers the flexibility provided by table storage. The "soft" bit estimates may depend on statistics which govern the various disturbances and "noises" affecting the memory cells and that are responsible for distorting the stored data in the cell. For example, the "soft" bit estimates may depend on the probability density function Pr(Vt|s; Vn). These statistics can change during the development of the process used for fabrication of Flash memory as this process improves over time, resulting in smaller "noises" and disturbance effects. When designing a Flash controller, which may contain an ECC decoder and its initialization block, the final statistics which govern the various "noises" and disturbances affecting Flash cells may not be known, since the controller may be developed concurrently with Flash process development and improvement. As a result, flexibility of the decoder initialization block may enable the statistical model based on which the "soft" bit estimates are generated to be updated when an updated statistical model is available. Implementing the decoder initialization block using a LUT, as illustrated in the process 906 and further described with respect to FIGS. 11-12, provides an elegant solution. Another solution, as illustrated in the process 904 and further described with respect to FIG. 13, is to implement the block which computes the "soft" bits estimates using a parametric model (e.g. by curve fitting the function in Eq. (1) into a parametric function) and allowing updates of the model parameters.

A LUT used by a decoder initialization block can be generated offline based on the qualification process of the Flash technology. Alternatively, the LUT can be calibrated per lot, wafer, die, block or page during manufacturing. Another option is to use an "offline" pre-computed LUT, generated based on the technology qualification data. The pre-computed LUT can be fine tuned per lot, wafer, die, block or page during manufacturing. A fourth option is to use "online" estimation during the lifetime of a Flash memory by measuring statistics governing cell behavior during its lifetime.

A decoder initialization block can use more than one "soft" bit estimate function or LUT. The decoder can choose an appropriate function or LUT to use based on one or more of the following criteria/inputs:

1) Used reading resolution (SB#);
2) Used reading thresholds (Vread);
3) Number of neighboring cells that are used for producing the "soft" bit estimates (Neighbors#);
4) Block and/or page number (Block#/Page#);
5) Number of write/erase cycles that the read block/page has endured (W/E#);

6) The time that has elapsed since the read block/page was programmed ("time tag"). Note that the "time tag" may not represent actual time, but it may be any parameter that has some correlation with the elapsed time (TimeTag);

7) Temperature—during reading or programming or both (Temp/ΔTemp);

8) Cell error rate estimation (CER);

9) Syndrome weight—i.e. a number of ECC parity-checks that are satisfied before decoding (W);

10) Cell Voltage Distribution (CVD) statistics—e.g. results of a CVD tracking procedure which may identify specific "noises" or disturbance effects that occurred (CVD-param); and 11) Results of previous decoding attempts—repeated attempts to decode the same ECC codeword can be performed using different initialization functions/LUTs.

Hence, generalizing Eq. (1), the decoder initialization function can be also a function of any subset $\theta \subseteq \Theta$ of the parameters set:

$$\Theta = \{SB\#, Vread, \text{Neighbors}\#, Block\#, Page\#, W/E\#,$$
$$\text{TimeTag}, Temp, \Delta Temp, CER, S, W, CVD\text{-}param \ldots \}$$

Eq. 2

$$LLR(b \mid v_t; v_n, \theta) = \log\frac{Pr(b=0 \mid v_t; v_n, \theta)}{Pr(b=1 \mid v_t; v_n, \theta)} = \log\frac{\sum_{s:b=0} Pr(v_t \mid s; v_n, \theta)}{\sum_{s:b=1} Pr(v_t \mid s; v_n, \theta)} \quad (2)$$

Using the process 902, configuring the decoder initialization block may require estimation of the disturbance value d=E[disturbance|Vn,Vt]. This involves reading the target cells at two conditions, one being erased neighbors (i.e. before disturbance) and the other being programmed neighbors to each pattern (i.e. after disturbance) and measuring the average difference in the read value of target cells between these two conditions. This procedure can be cumbersome and may involve reading at two conditions and programming in between the readings. As a result, the procedure may be difficult to use, at least for estimation during manufacturing or for "online" estimation during lifetime of the device.

As opposed to the process 902, configuring the decoder initialization block according to the process 904 or the process 906 may be much simpler and may involve a single reading (with no programming). In order to compute the initialization function of process 904 or the LUT of process 906, the probability density function $P_r(Vt|s;Vn,\theta)$ can be estimated. For example, a large population of cells (e.g. a block) may be read and the population of cells may be divided into subsets according to the programmed (or estimated) state of the target cell and according to the read values of its neighbors. Each read cell may be associated with one of the subsets according to its programmed or read state and according to the programmed states or read values of its neighboring cells. Then, for the subset of cells programmed to state s, whose neighboring cells were read at values Vn, the probability density function $P_r(Vt|s;Vn,\theta)$ may be empirically estimated as the histogram of the read target cell values Vt. The estimated probability density function $P_r(Vt|s;Vn,\theta)$ can be used for deriving the decoder initialization function or LUT according to Eq. (2). The estimation procedure can be preformed "offline" based on measurements taken during the qualification process of the Flash technology. Alternatively the estimation procedure can be performed per lot, wafer, die, block or page during manufacturing of the memory. Another option is to perform the estimation procedure "online" during the lifetime of the memory. The estimation can also be performed at various conditions of the memory (e.g. different cycling and data retention conditions, different temperature conditions, etc.) in order to produce several decoder initialization functions or LUTs that can be used by the decoder initialization block according to one or more of the listed parameters.

Figure 10:
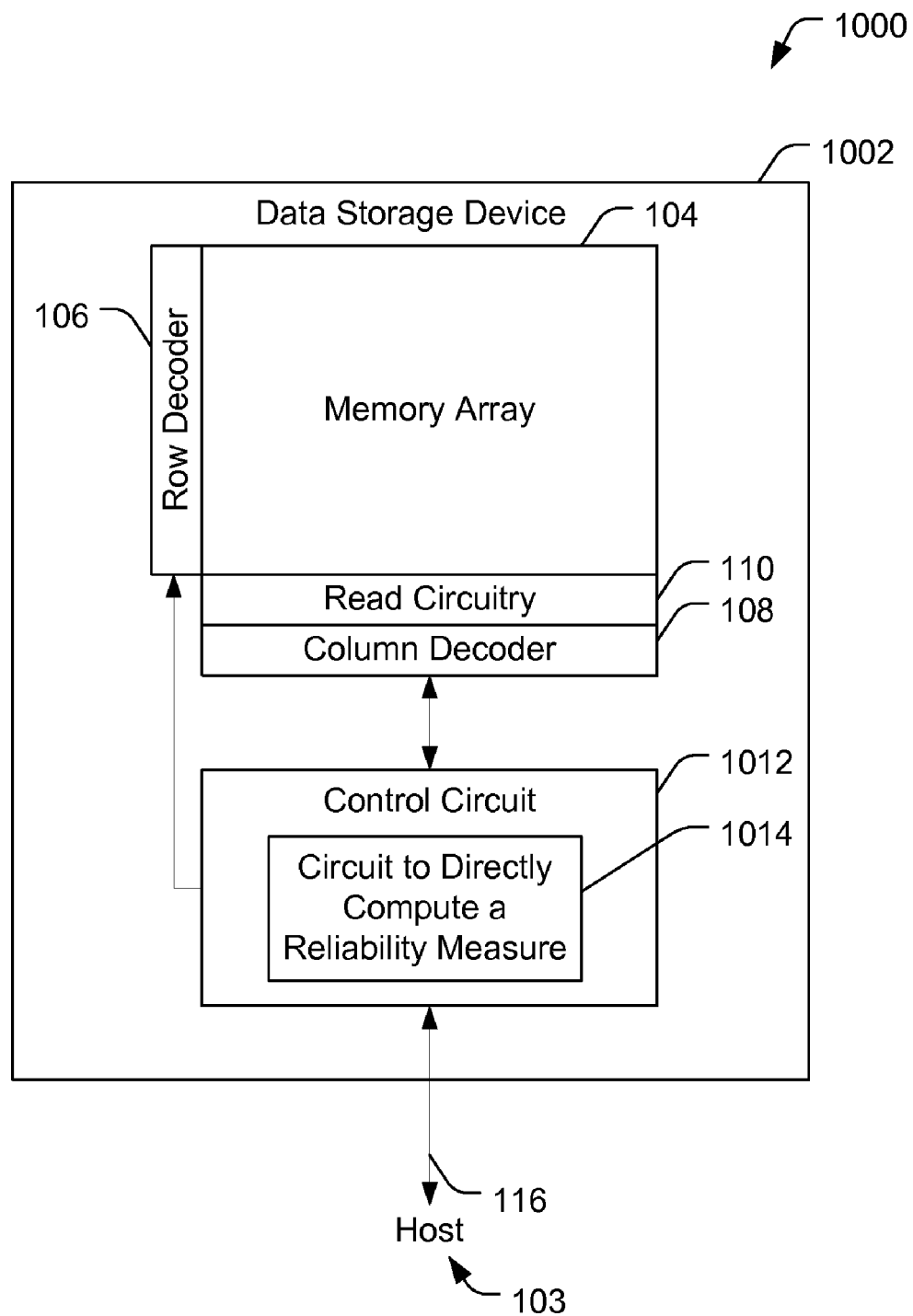
FIG. 10 is a block diagram of a particular embodiment of a system to read data using a directly computed reliability measure.

FIG. 10 is a block diagram of a particular embodiment of a system 1000 to read data using a directly computed reliability measure according to the process 904 or 906 of FIG. 9. The system 1000 includes a data storage device 1002 coupled to the host 103 via the channel 116 of FIG. 1. The data storage device 1002 includes the memory array 104, the row decoder 106, the column decoder 108, and the read circuitry 110 as in FIG. 1. A control circuit 1012 includes a circuit to directly compute a reliability measure 1014.

The circuit to directly compute the reliability measure 1014 may operate to compute the "soft" bit estimates according to the process 904 of FIG. 9. For example, the control circuit 1012 may receive threshold voltages from the read circuitry 110 corresponding to a target cell and one or more neighbor cells. The circuit to directly compute the reliability measure 1014 may receive the threshold values and may directly compute a reliability measure that corresponds to an estimated bit value for the target cell, such as an LLR value. The directly computed reliability measure that corresponds to the estimated bit value may be provided as a "soft" bit to an ECC decoder (not shown) to generate decoded data.

As another example, the circuit to directly compute the reliability measure 1014 may operate to compute the "soft" bit estimates according to the process 906 of FIG. 9. For example, the control circuit 1012 may receive threshold voltages from the read circuitry 110 corresponding to a target cell and one or more neighbor cells. The circuit to directly compute the reliability measure 1014 may receive the threshold voltages and may directly compute a reliability measure that corresponds to an estimated bit value for the target cell, such as an LLR value, by retrieving the reliability measure from a look up table based on the received threshold voltages. The directly computed reliability measure that corresponds to the estimated bit value may be provided as a "soft" bit to an ECC decoder (not shown) to generate decoded data.

FIG. 11 is a block diagram of a particular embodiment of a system 1100 to read data using a directly computed reliability measure determined according to the process 906 of FIG. 9. The system 1100 includes a data storage device 1102 coupled to the host 203 via the channel 290 of FIG. 2. The data storage device 1102 includes the memory die 204 including the control circuitry 208, the row decoder 212, the column decoder 214, the read/write circuitry 216, and the memory array 210 of FIG. 2.

A controller 1106 is coupled to the memory die 204 and includes the processor 240, the memory 242, and the ECC decoder 244 of FIG. 2. The memory 242 includes instructions 1146 that are executable by the processor 240 to directly compute a reliability measure by locating an entry in a look up table 1148 based on a target memory cell voltage value 1150 and one or more other memory cell voltage values 1152. The located entry is used to generate the reliability indicator 262 that is associated with the data 260 and that is provided to the ECC decoder 244. For example, the reliability indicator 262 may correspond to a reliability measure that is retrieved from the look up table 1148. The look up table 1148 may be selected from a set of pre-loaded look up tables according to one or more selection criteria, as described with respect to FIG. 12.

FIG. 12 is a general diagram of a system 1200 having a set of tables including a representative table 1202 used to directly compute a reliability measure. The representative table 1202 may be one of several tables and includes multiple entries such as a representative entry 1230 that stores a reliability measure 1236 that corresponds to a target cell voltage 1232 and one or more other cell voltages 1234. The table 1202 may be populated via an external source of data 1204 or may use a probability density function of target cell values 1224 and the table 1202 may be selected for access according to table selection criteria 1214. For example, the table 1202 may be the look up table 1148 of the data storage device 1102 of FIG. 11.

The external source of data 1204 may include data that is provided from a source external to a data storage device that stores the table 1202. For example, the table data may be provided based on one of a qualification process of the data storage device 1206, a calibration of the table during manufacture of the data storage device 1208, and a pre-computation based on memory technology qualification data 1210. The data may be provided based on a statistical analysis of a memory that includes the target memory cell and the one or more other memory cells 1212.

The table 1202 may be populated with data that is based on the probability density function of target cell values 1224. The probability density function of target cell values 1224 may be estimated using a histogram of read target cell values.

The table 1202 may be chosen based at least in part on read parameters 1216, such as used reading resolution of a used reading threshold. The table 1202 may be chosen (e.g. selected by the controller 1106 of FIG. 11) based at least in part on a location or error rate parameter 1218, such as one of a number of neighboring cells that are used for producing a soft bit estimate, one of a block number and a page number, a cell error rate estimation, and a number of error correction code parity checks. The table 1202 may be chosen based at least in part on an environmental-type parameter 1220, such as one of a number of write cycles or a number of erase cycles of a read block or a read page, a parameter that is associated with an elapsed time, and a temperature of the data storage device during one or more of reading and programming. The table 1202 may be chosen based at least in part on a statistical or historical parameter 1222, such as one of cell voltage distribution characteristics and results of previous decoding attempts associated with the target memory cell.

FIG. 13 is a block diagram of a particular embodiment of a controller that can be used in the system of FIG. 10 to implement the process 904 of FIG. 9. The controller 1306 includes the processor 240, the memory 242, and the ECC decoder 244 of FIG. 2. The memory 242 includes instructions 1346 that are executable by the processor 240 to cause the processor 240 to directly compute a reliability measure by applying a parametric model 1348 to a target memory cell voltage value 1350 and to one or more other memory cell voltage values 1352. The parametric model 1348 may be generated by curve fitting a reliability measure, such as a log likelihood ratio, into a parametric function, illustrated as reliability measure curve fit data 1354. The reliability measure may be provided as the reliability indicator 262 associated with the data 260 provided to the ECC decoder 244.

Figure 14:
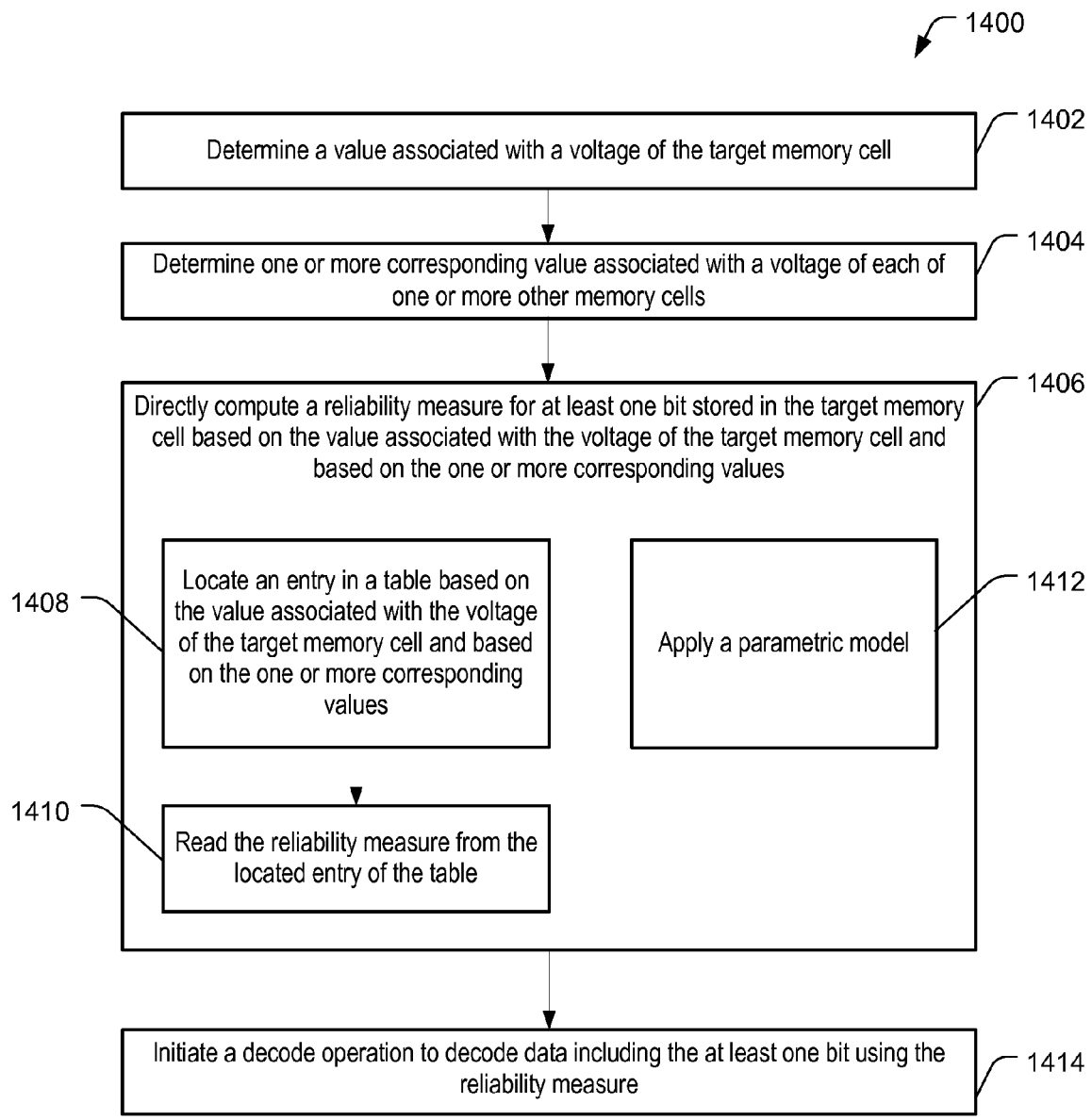
FIG. 14 is a flow diagram of a particular embodiment of a method of reading data using a directly computed reliability measure.

FIG. 14 is a flow diagram of a particular embodiment of a method 1400 of reading data from a target memory cell. The method 1400 may be performed in a data storage device including the target memory cell and one or more other memory cells. For example, the method 1400 may be used with the memory device 102 of FIG. 1, the memory device 202 of FIG. 2, the data storage device 1000 of FIG. 10, or the data storage device 1100 of FIG. 11.

A value associated with a voltage of the target memory cell is determined, at 1402. One or more corresponding values are determined, at 1404. Each of the one or more corresponding values is associated with a voltage of a respective one of the one or more other memory cells. As an illustrative example, the value associated with the voltage of the target memory cell may be determined by sensing a threshold voltage. The sensing may be performed during a sensing operation that includes generating a signal indicating a threshold voltage of the target memory cell and comparing the generated signal to one or more reference values. The sensing operation may generate a bit pattern that indicates a voltage band in which the threshold value of the target memory cell resides. The one or more corresponding values may also be determined using one or more sensing operations that return a bit pattern or other value representing a sensed threshold voltage for each of the one or more other memory cells. For example, the one or more other memory cells may include two memory cells that are coupled to a same wordline as the target memory cell and that may be sensed concurrently with the target memory cell. To illustrate, when the target cell is the cell 262 of FIG. 2 at wordline WL(i) and bitline BL(j), the corresponding voltage values may be sensed from neighbor cells at the wordline WL(i) and the bitlines BL(j−1) and BL(j+1). As another example, the corresponding voltage values may be read from neighbor cells to the target memory cell, where the target memory cell is coupled to a first wordline (e.g. WL(i)) and at least one neighbor cell is coupled to a second wordline (e.g. WL(i+1)).

A reliability measure is directly computed for at least one bit stored in the target memory cell based on the value associated with the voltage of the target memory cell and based on the one or more corresponding values associated with voltages of the one or more other memory cells, at 1406. The reliability measure is "directly computed," meaning that a value of the reliability measure is determined without passing through a voltage distortion value associated with the target memory cell.

In a particular embodiment, directly computing the reliability measure may be performed by locating an entry in a table based on the value associated with the voltage of the target memory cell and based on the one or more corresponding values associated with voltages of the one or more other memory cells, at 1408, and reading the reliability measure from the located entry of the table, at 1410.

In another embodiment, directly computing the reliability measure is performed by applying a parametric model to the value associated with the voltage of the target memory cell and to the one or more corresponding values associated with voltages of the one or more other memory cells, at 1412. The parametric model may be generated by curve fitting a log likelihood ratio into a parametric function. As an example, the parametric model may be the parametric model 1348 of FIG. 13.

A decode operation is initiated to decode data including the at least one bit using the reliability measure, at 1414. For example, the decode operation may be initiated by providing data including an estimated bit value of the target cell and the reliability measure to an ECC decoder (e.g. the data 260 and the reliability indicator 262 may be provided to the ECC decoder 244 of FIG. 11), and asserting a control signal to cause the ECC decoder to read the data and reliability values and perform an ECC decode operation.

In an embodiment that includes using a table to directly compute (e.g. receiving a pre-computed reliability value) the reliability measure (e.g. at 1408-1410), data may be provided to the table via a source external to the data storage device. For example, the data may be provided based on one of a calibration of the table during manufacture of the data storage device, and a pre-computed table based on memory technology qualification data. As another example, the data may be provided based on a statistical analysis of a memory that includes the target memory cell and the one or more other memory cells.

Alternatively, the table may be populated with data based on a probability density function of target cell values. The probability density function may be estimated using a histogram of read target cell values.

The table may be selected from multiple available tables, such as described with respect to FIG. 12, based on one or more criteria. For example, the table may be chosen based at least in part on a used reading resolution or a used reading threshold. As another example, the table may be chosen based at least in part on one of a number of neighboring cells that are used for producing a soft bit estimate, one of a block number and a page number, a cell error rate estimation, and a number of error correction code parity checks. As another example, the table may be chosen based at least in part on one of a number of write cycles or a number of erase cycles of a read block or a read page, a parameter that is associated with an elapsed time, and a temperature of the data storage device during one or more of reading and programming. As a further example, the table may be chosen based at least in part on one of cell voltage distribution characteristics and results of previous decoding attempts associated with the target memory cell.

Although various components depicted herein are illustrated as block components and described in general terms, such components may include one or more microprocessors, state machines, or other circuits configured to enable the memory device 102 of FIG. 1, the memory device 202 of FIG. 2, the data storage device 1002 of FIG. 10, the data storage device 1102 of FIG. 11, or the controller 1306 of FIG. 13, to perform the particular functions attributed to such components, or any combination thereof. For example, the control circuit 1012, the circuit to directly compute a reliability measure 1014, or both, of FIG. 10 may represent physical components, such as controllers, state machines, logic circuits, or other structures to enable the data storage device 1002 to receive and respond to data requests from a host device or from other external devices to access and process data by directly determining a reliability measure for data read from the memory array 104.

The circuit to directly compute a reliability measure 1014 of FIG. 10 may be implemented using a microprocessor or microcontroller programmed to use combination values read from a target cell and one or more neighboring cells to generate a reliability measure of an estimated bit value at an addressed cell. In a particular embodiment, the circuit to directly compute the reliability measure 1014 of FIG. 10 includes executable instructions that are executed by a processor and the instructions are stored at the memory array 104. Alternatively, or in addition, executable instructions that are executed by the processor included in the circuit to directly compute the reliability measure 1014 of FIG. 10 may be stored at a separate memory location that is not part of the memory array 104, such as at a read-only memory (ROM) (not shown).

In a particular embodiment, the memory device 102 may be a portable device configured to be selectively coupled to one or more external devices. However, in other embodiments, the memory device may be attached or embedded within one or more host devices, such as within a housing of a portable communication device. For example, the storage device may be within a packaged apparatus such as a wireless telephone, personal digital assistant (PDA), gaming device or console, portable navigation device, or other device that uses internal non-volatile memory. In a particular embodiment, the memory device 102 is a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. Accordingly, the disclosure and the figures are to be regarded as illustrative rather than restrictive.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for reading data from a target memory cell, the method comprising:
in a data storage device including the target memory cell and one or more other memory cells, performing:
determining a value associated with a voltage of the target memory cell;

determining one or more corresponding values, wherein each of the one or more corresponding values is associated with a voltage of a respective one of the one or more other memory cells;

directly computing a reliability measure for at least one bit stored in the target memory cell based on the value associated with the voltage of the target memory cell and based on the one or more corresponding values; and initiating a decode operation to decode data including the at least one bit using the reliability measure.

2. The method of claim 1, wherein directly computing the reliability measure is performed by applying a parametric model to the value and to the one or more corresponding values.

3. The method of claim 2, wherein the parametric model is generated by curve fitting a log likelihood ratio into a parametric function.

4. The method of claim 1, wherein directly computing the reliability measure is performed by:

locating an entry in a table based on the value associated with the voltage of the target memory cell and based on the one or more corresponding values; and reading the reliability measure from the located entry of the table.

5. The method of claim 4, wherein data is provided to the table via a source external to the data storage device.

6. The method of claim 5, wherein the data is provided based on one of:

calibrating the table during manufacture of the data storage device; and a pre-computed table based on memory technology qualification data.

7. The method of claim 5, wherein the data is provided based on a statistical analysis of a memory that includes the target memory cell and the one or more other memory cells.

8. The method of claim 4, wherein the table is chosen based at least in part on one of:

a used reading resolution; and a used reading threshold.

9. The method of claim 4, wherein the table is chosen based at least in part on one of:

a number of neighboring cells that are used for producing a soft bit estimate;

one of a block number and a page number;

a cell error rate estimation; and a number of error correction code parity checks.

10. The method of claim 4, wherein the table is chosen based at least in part on one of:

a number of write cycles or a number of erase cycles of a read block or a read page;

a parameter that is associated with an elapsed time; and a temperature of the data storage device during one or more of reading and programming a memory cell.

11. The method of claim 4, wherein the table is chosen based at least in part on one of:

cell voltage distribution characteristics; and results of previous decoding attempts associated with the target memory cell.

12. The method of claim 4, wherein the table is populated with data based on a probability density function of target cell values.

13. The method of claim 12, wherein the probability density function is estimated using a histogram of read target cell values.

14. The method of claim 1, wherein the one or more other memory cells includes two memory cells and wherein the two memory cells are coupled to a same wordline as the target memory cell.

15. The method of claim 1, wherein the one or more other memory cells includes one or more neighbor cells to the target memory cell, wherein the target memory cell is coupled to a first wordline and at least one neighbor cell is coupled to a second wordline.

16. A data storage device comprising:

a memory including a target memory cell and one or more other memory cells;

a controller coupled to the memory, wherein the controller is configured to directly compute a reliability measure for at least one bit stored in the target memory cell of the memory based on a voltage value associated with the target memory cell and based on one or more corresponding voltage values associated with each of the one or more other memory cells of the memory; and an error correction code (ECC) decoder coupled to the controller and configured to receive the reliability measure and to decode data including the at least one bit using the reliability measure.

17. The data storage device of claim 16, wherein the controller is further configured to:

locate an entry in a table based on the voltage value associated with the target memory cell and based on the one or more corresponding voltage values; and read the reliability measure from the located entry of the table.

18. The data storage device of claim 16, wherein the controller is configured to directly compute the reliability measure by applying a parametric model to the voltage value and to the one or more corresponding voltage values.

19. The data storage device of claim 18, wherein the parametric model is generated by curve fitting a log likelihood ratio into a parametric function.

20. The data storage device of claim 16, wherein the one or more other memory cells include two memory cells and wherein the two memory cells are coupled to a same wordline as the target memory cell.

21. The data storage device of claim 16, wherein the one or more memory cells include one or more neighbor cells to the target memory cell, wherein the target memory cell is coupled to a first wordline and at least one of the one or more neighbor cells is coupled to a second wordline.

* * * * *